US012424595B2

(12) United States Patent
Lee et al.

(10) Patent No.: US 12,424,595 B2
(45) Date of Patent: Sep. 23, 2025

(54) SEMICONDUCTOR DEVICE AND METHOD OF FORMING PACKAGE WITH DOUBLE-SIDED INTEGRATED PASSIVE DEVICE

(71) Applicant: STATS ChipPAC Pte. Ltd., Singapore (SG)

(72) Inventors: TaeKeun Lee, Incheon (KR); Hyunil Bae, Chungcheongnam-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 453 days.

(21) Appl. No.: 17/820,156

(22) Filed: Aug. 16, 2022

(65) Prior Publication Data

US 2024/0063196 A1   Feb. 22, 2024

(51) Int. Cl.
*H01L 25/16*   (2023.01)
*H01L 21/48*   (2006.01)
(Continued)

(52) U.S. Cl.
CPC ........ *H01L 25/165* (2013.01); *H01L 21/4853* (2013.01); *H01L 23/13* (2013.01); *H01L 23/3675* (2013.01); *H01L 23/49811* (2013.01); *H01L 23/49838* (2013.01); *H01L 23/552* (2013.01); *H01L 24/13* (2013.01); *H01L 24/16* (2013.01); *H01L 24/32* (2013.01);
(Continued)

(58) Field of Classification Search
CPC ..... H01L 21/4853; H01L 21/60; H01L 23/13; H01L 23/3675; H01L 23/49811; H01L 23/49838; H01L 23/552; H01L 23/488; H01L 43/5226; H01L 24/13; H01L 24/16; H01L 24/32; H01L 24/73; H01L 24/05; H01L 24/11; H01L 24/81; H01L 24/92; H01L 24/03; H01L 25/165; H01L 25/0657; H01L 25/50; H01L 25/16; H05K 1/181
See application file for complete search history.

(56) References Cited

U.S. PATENT DOCUMENTS 8,912,662 B2   12/2014   Chun
9,391,046 B2   7/2016    Park et al.
(Continued)

*Primary Examiner* — Fernando L Toledo
*Assistant Examiner* — Ryan T. Fortin
(74) *Attorney, Agent, or Firm* — Robert D. Atkins; PATENT LAW GROUP: Atkins and Associates, P.C.

(57) ABSTRACT

A semiconductor device has a semiconductor die, substrate, and plurality of first conductive pillars formed over the semiconductor die or substrate. Alternatively, the first conductive pillars formed over the semiconductor die and substrate. An electrical component is disposed over the semiconductor die. The electrical component can be a double-sided IPD. The semiconductor die and electrical component are disposed over the substrate. A shielding frame is disposed over the semiconductor die. A plurality of second conductive pillars is formed over a first surface of the electrical component. A plurality of third conductive pillars is formed over a second surface of the electrical component opposite the first surface of the electrical component. A bump cap can be formed over a distal end of the conductive pillars. The substrate has a cavity and the electrical component is disposed within the cavity. An underfill material is deposited between the semiconductor die and substrate.

25 Claims, 21 Drawing Sheets

(51) Int. Cl.
*H01L 23/00* (2006.01)
*H01L 23/13* (2006.01)
*H01L 23/367* (2006.01)
*H01L 23/498* (2006.01)
*H01L 23/552* (2006.01)
*H01L 25/065* (2023.01)

(52) U.S. Cl.
CPC .............. *H01L 24/73* (2013.01); *H01L 24/48* (2013.01); *H01L 25/0657* (2013.01); *H01L 2224/13582* (2013.01); *H01L 2224/13655* (2013.01); *H01L 2224/1601* (2013.01); *H01L 2224/16227* (2013.01); *H01L 2224/16265* (2013.01); *H01L 2224/32225* (2013.01); *H01L 2224/32265* (2013.01); *H01L 2224/48227* (2013.01); *H01L 2224/73204* (2013.01); *H01L 2225/0651* (2013.01); *H01L 2225/06562* (2013.01); *H01L 2924/1616* (2013.01); *H01L 2924/16235* (2013.01); *H01L 2924/16251* (2013.01); *H01L 2924/3025* (2013.01)

(56) References Cited

U.S. PATENT DOCUMENTS

| | | |
|---|---|---|
| 10,804,204 B2 | 10/2020 | Rubin et al. |
| 2010/0237477 A1* | 9/2010 | Pagaila ................. H01L 25/105 257/E23.114 |
| 2012/0168916 A1* | 7/2012 | Chi ....................... H01L 23/552 257/E23.101 |
| 2015/0244410 A1* | 8/2015 | Leong .................... H01L 23/66 455/73 |
| 2023/0253380 A1* | 8/2023 | Weng ..................... H01L 24/24 257/774 |

\* cited by examiner

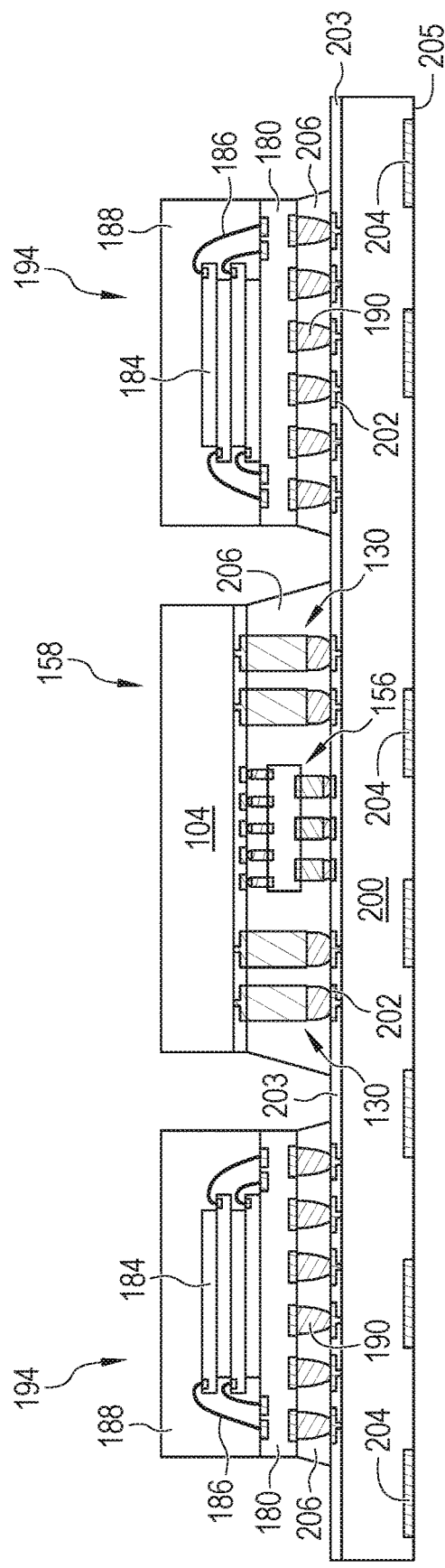
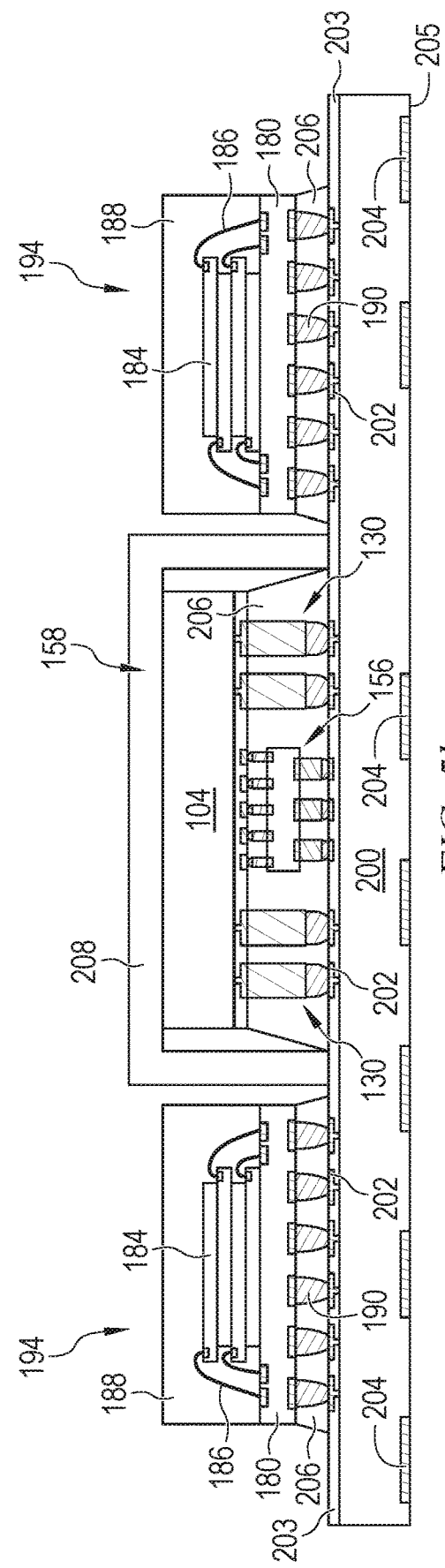

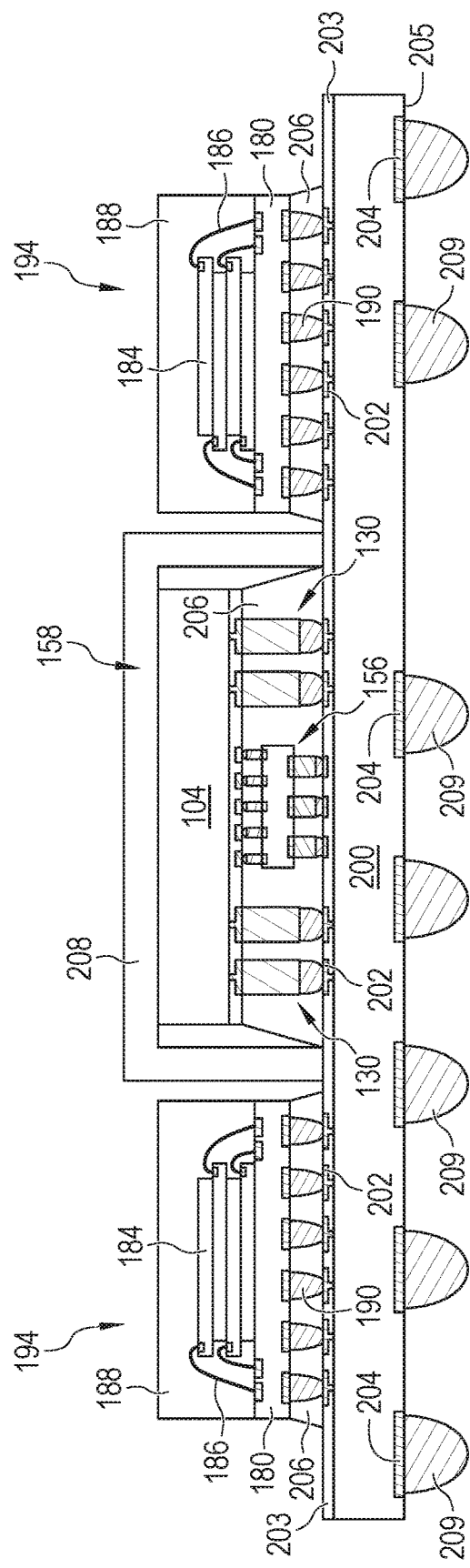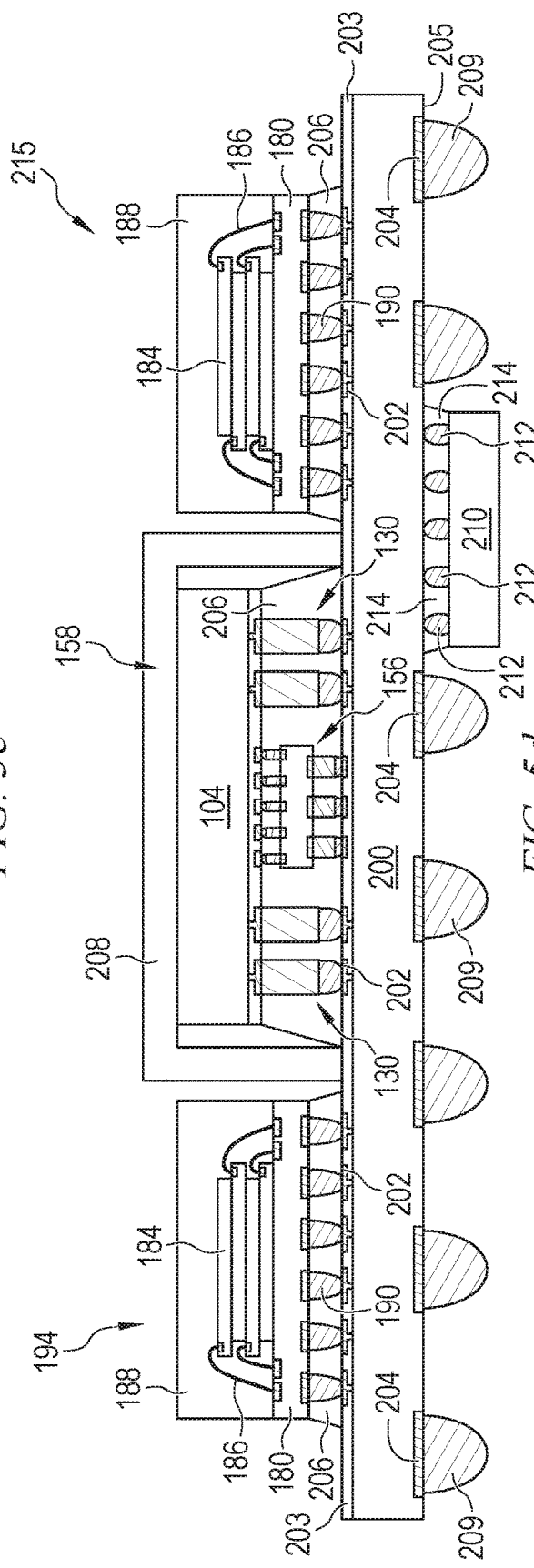

SEMICONDUCTOR DEVICE AND METHOD OF FORMING PACKAGE WITH DOUBLE-SIDED INTEGRATED PASSIVE DEVICE

FIELD OF THE INVENTION

The present invention relates in general to semiconductor devices and, more particularly, to a semiconductor device and method of forming a package with double-sided integrated passive device (IPD) with shielding.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices often contain one or more semiconductor die and integrated passive devices (IPDs) to perform necessary electrical functions. The trend is toward higher performance, higher integration, and miniaturization for applications. Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generates interference. The combination of digital circuit with IPD require shielding to manage the interference. Meeting the above goals simultaneously in one semiconductor package is a difficult task.

BRIEF DESCRIPTION OF THE DRAWINGS

FIGS. 5a-5d illustrate the semiconductor package from FIGS. 2a-2l and semiconductor package from FIG. 4a-4c on a substrate;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
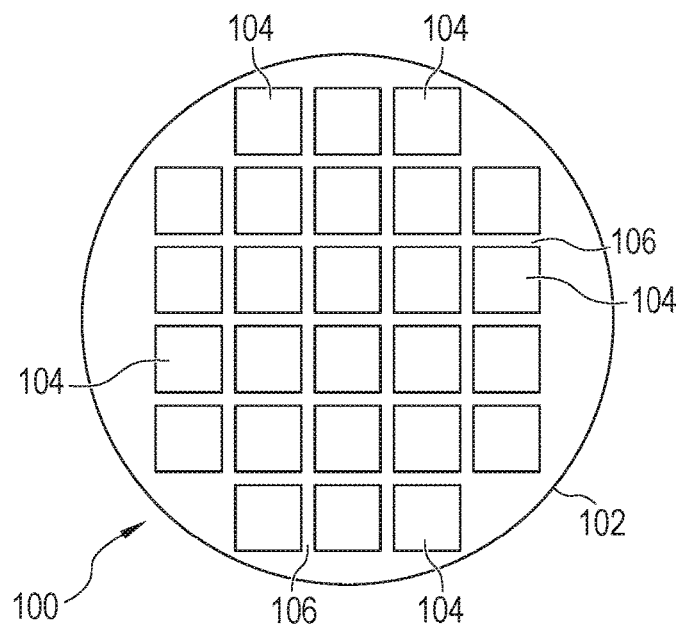
FIGS. 1a-1b illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
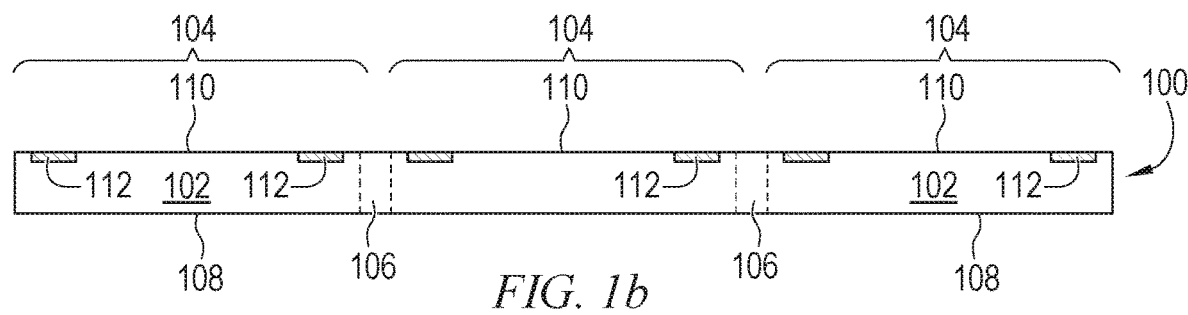

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 2A:
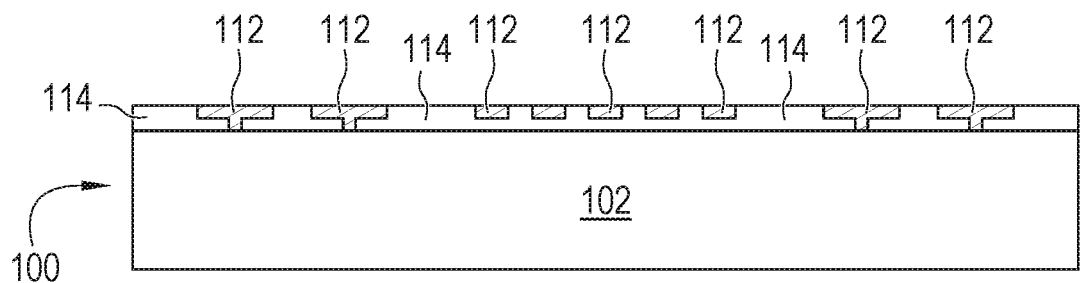
FIGS. 2a-2p illustrate forming a semiconductor package with a semiconductor die and double-sided IPD attached between conductive pillars.

FIG. 2a shows further detail of a portion of semiconductor wafer 100 with conductive layers 112 and insulating layers 114. Insulating layers 114 contain one or more layers of silicon dioxide (SiO2), silicon nitride (Si3N4), silicon oxynitride (SiON), tantalum pentoxide (Ta2O5), aluminum oxide (Al2O3), photoresist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layers 114 provide isolation between conductive layers 112.

Figure 2B:
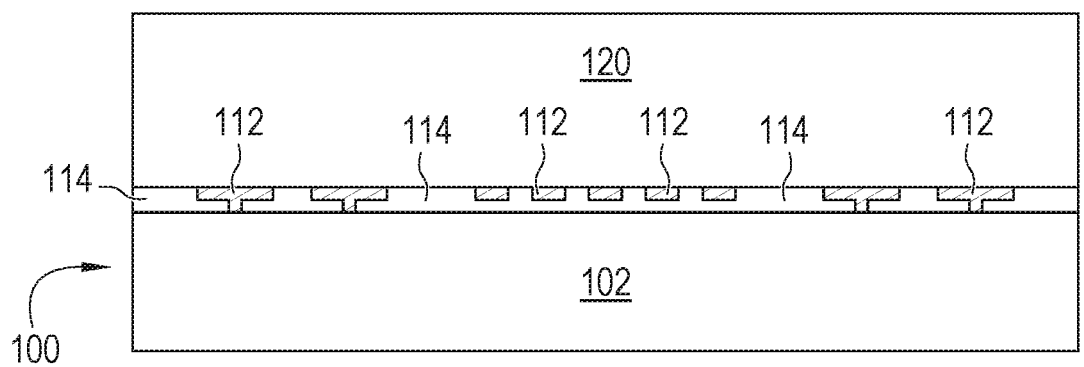
Figure 2C:
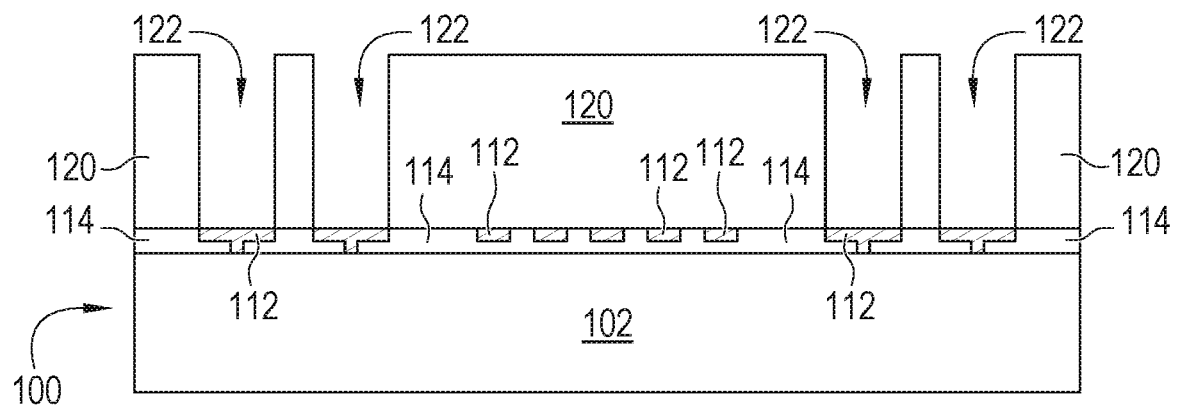
Figure 2D:
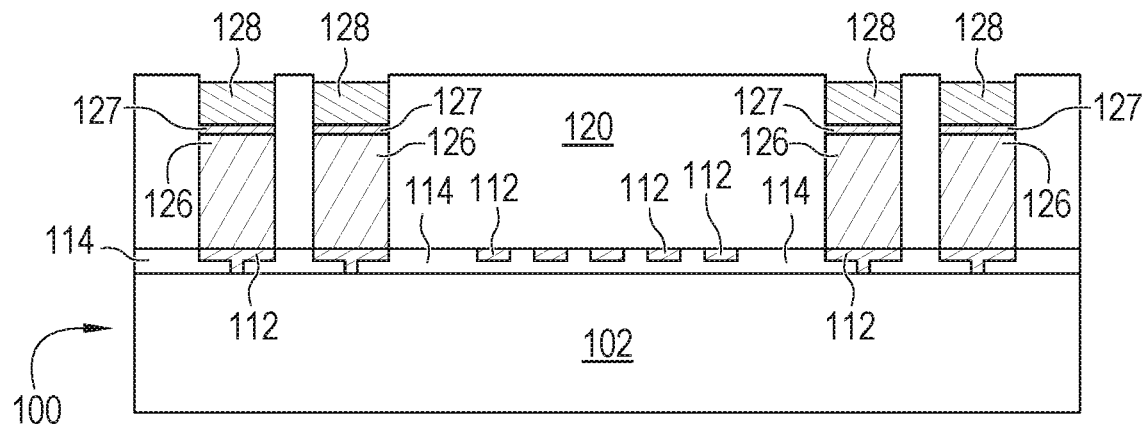
Figure 2E:
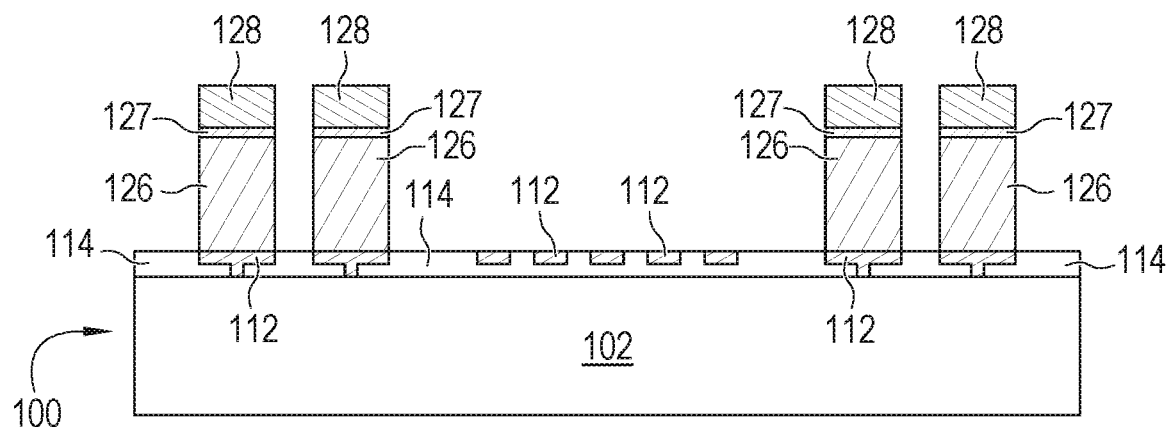
Figure 2F:
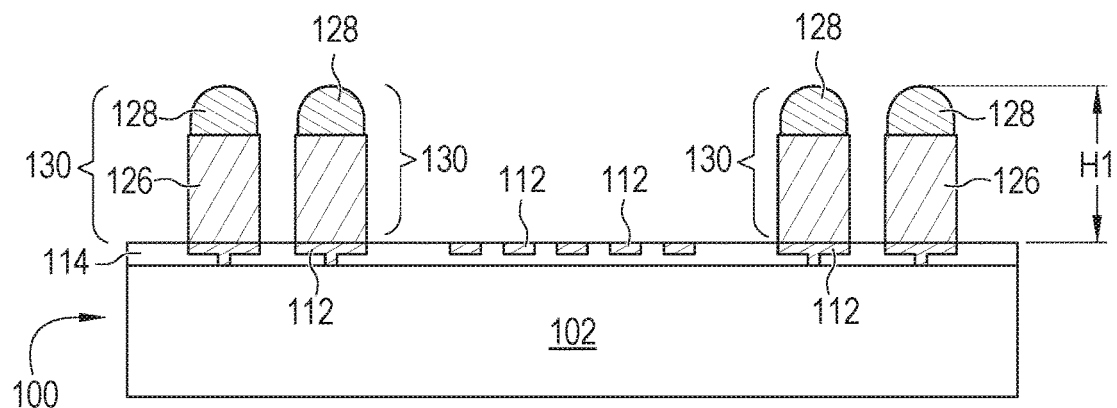

In FIG. 2b, solder resist or photoresist 120 is formed over conductive layer 112 and insulating layer 114. In FIG. 2c, photoresist 120 is exposed, developed, and etched to form vias 122 for the locations of conductive posts 130. In FIG. 2d, vias 122 are filled with conductive material, such as Al, Cu, Sn, Ni, Au, Ag, or other suitable electrically conductive material, to form vertical shafts 126. Ni layer 127 is formed over a top surface of vertical shafts 126. Bump material 128 is deposited over Ni layer 127. Bump material 128 can be Al, Sn, Ni, Au, Ag, Pb, Bi, Cu, solder, and combinations thereof, with an optional flux solution. In one embodiment, bump material 128 is lead-free solder. In FIG. 2e, the remaining photoresist 120 is removed by photoresist stripping, wafer plasma, etching of seed layers, scrubber cleaning, wafer plasma, scrubber cleaning, etching, scrubber cleaning, and wafer plasma, leaving vertical shafts 126, Ni layer 127, and bump material 128. In FIG. 2f, bump material 128 is reflowed followed by flux cleaning, scrubber cleaning ball shear and measurement, to form bump caps on the distal end of vertical shafts 126, collectively referred to as conductive pillars or columns 130. In one embodiment, conductive pillars 130 have a height H1 of 20-30 μm, diameter of 10-15 μm, and pitch of 30 μm.

Figure 2G:
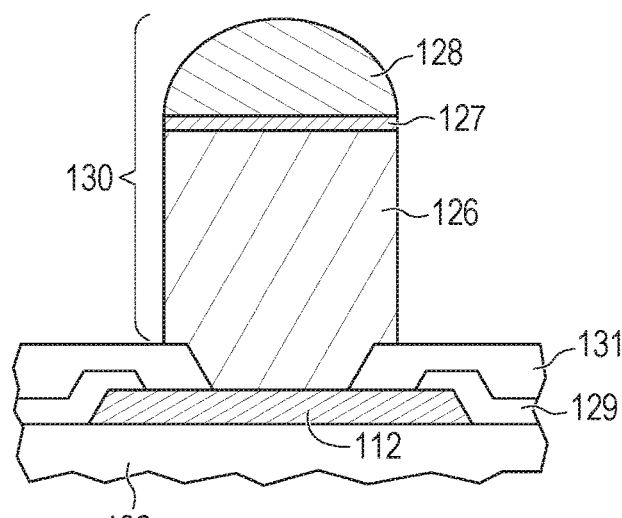

FIG. 2g illustrates further detail of conductive pillar 130. Conductive layer 112 is formed over base substrate material 102. Insulating layer 129 is formed over base substrate material 102 and conductive layer 112. Insulating layer 131 is formed over insulating layer 129 and conductive layer 112. Insulating layers 129 and 131 contain one or more layers of SiO2, Si3N4, SiON, Ta2O5, Al2O3, photoresist, polyimide, BCB, PBO, and other material having similar insulating and structural properties. Insulating layers 129 and 131 can be formed using PVD, CVD, printing, lamination, spin coating, spray coating, sintering or thermal oxidation. Insulating layer 114 is a simplification of the more detailed insulating layers 129-131.

Figure 2H:
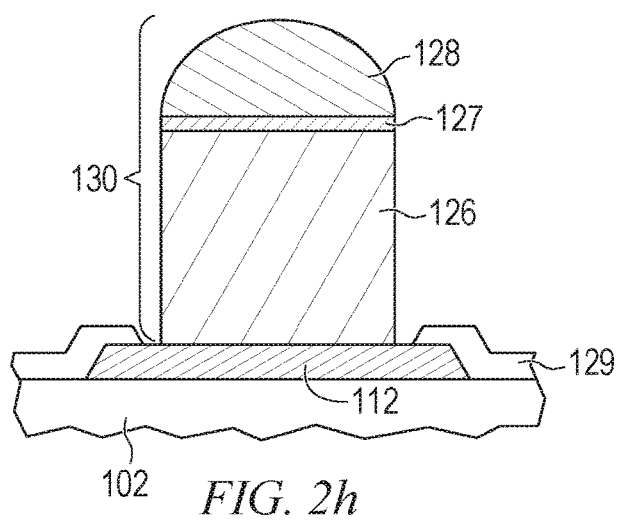

FIG. 2h illustrates further detail of another embodiment of conductive pillar 130. Conductive layer 112 is formed over base substrate material 102. Insulating layer 129 is formed over base substrate material 102 and conductive layer 112.

Figure 3A:
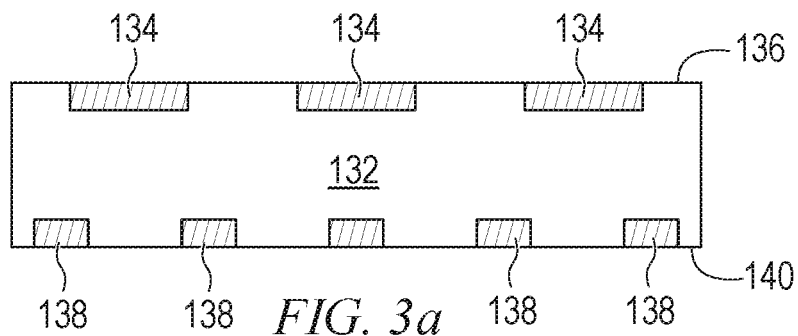
FIGS. 3a-3c illustrate a process of forming the double-sided IPD.

FIG. 3a shows semiconductor die 132, made similar to FIGS. 1a-1b. Semiconductor die 132 has a first active surface 136 and a second active surface 140 each containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surfaces 136 and 140 to implement analog circuits or digital circuits, such as DSP, ASIC, memory, or other signal processing circuit. Semiconductor die 132 may also contain IPDs, such as inductors, capacitors, and resistors, for RF signal processing. In one embodiment, semiconductor die 132 is a double-side IPD.

An electrically conductive layer 134 is formed over surface 136, and conductive layer 138 is formed over surface 140, using PVD, CVD, electrolytic plating, electroless plating process, or other suitable metal deposition process. Conductive layers 134 and 138 can be one or more layers of Al, Cu, Sn, Ni, Au, Ag, or other suitable electrically conductive material. Conductive layers 134 and 138 operate as contact pads electrically connected to the circuits or IPD on active surfaces 136 and 140, respectively.

Figure 3B:
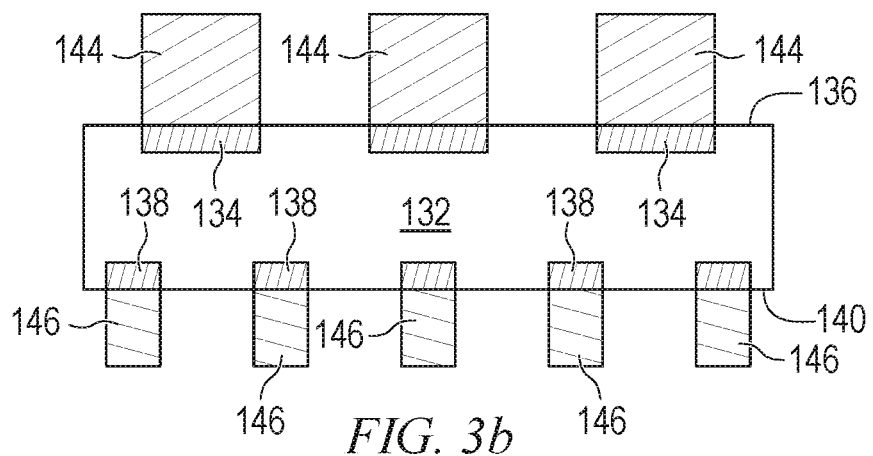
Figure 3C:
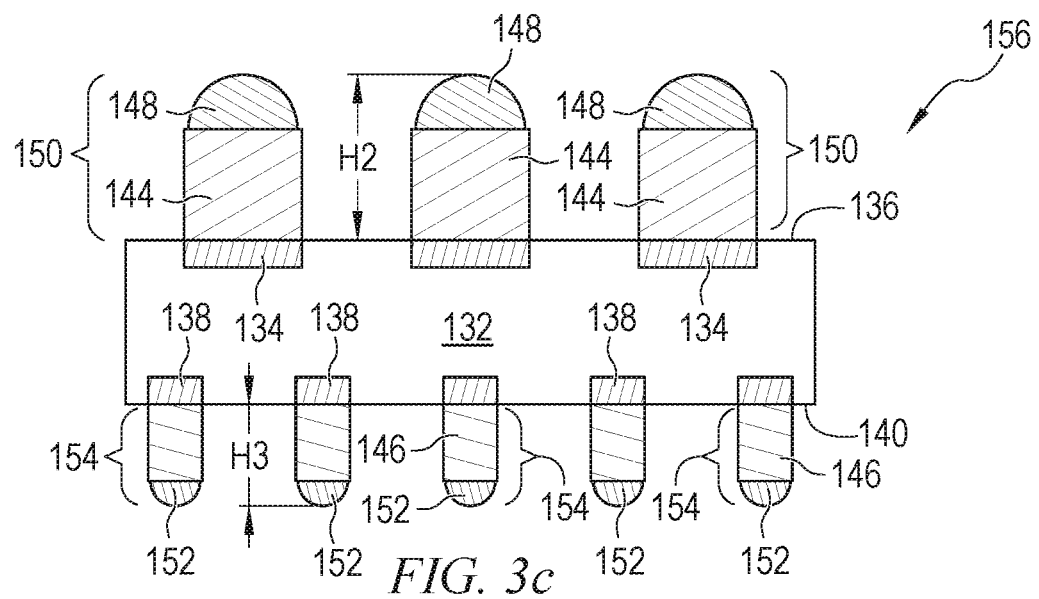

In FIG. 3b, a plurality of vertical shafts 144 is formed over conductive layer 134, similar to vertical shafts 126 in FIGS. 2b-2f. Likewise, a plurality of vertical shafts 146 is formed over conductive layer 138. In FIG. 3c, bump caps 148 are formed on the distal end of vertical shafts 144, collectively referred to as conductive pillars or columns 150, similar to FIGS. 2b-2f. Bump caps 152 are formed on the distal end of vertical shafts 146, collectively referred to as conductive pillars or columns 154, similar to FIGS. 2b-2f. Bump caps 148 and 152 can be Al, Sn, Ni, Au, Ag, Pb, Bi, Cu, solder, and combinations thereof, with an optional flux solution. In addition, epoxy flux may be applied to conductive pillar 154. The epoxy flux has function of flux and epoxy. After die attach, the epoxy part of the epoxy flux protects the bump of die. It can dispensed on conductive layer 112 or conductive pillar 154. In one embodiment, conductive pillars 150 have a height H2 of 20-30 μm, and conductive pillars 150 have a height H3 of 5-10 μm. The combination of semiconductor die 132 and conductive pillars 150 and 154 constitute electrical component 156.

Figure 2I:
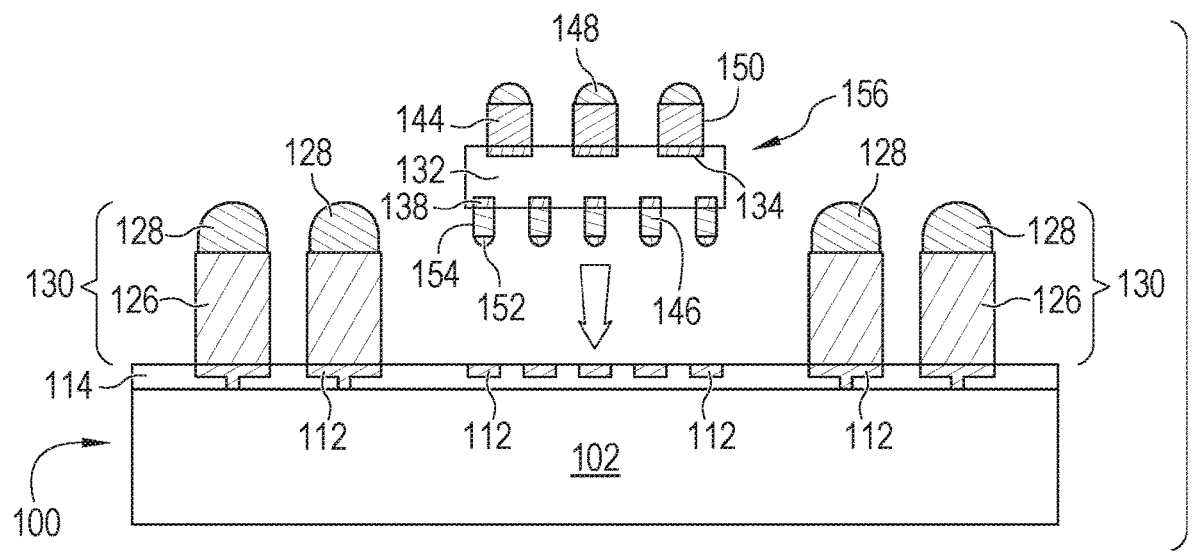
Figure 2J:
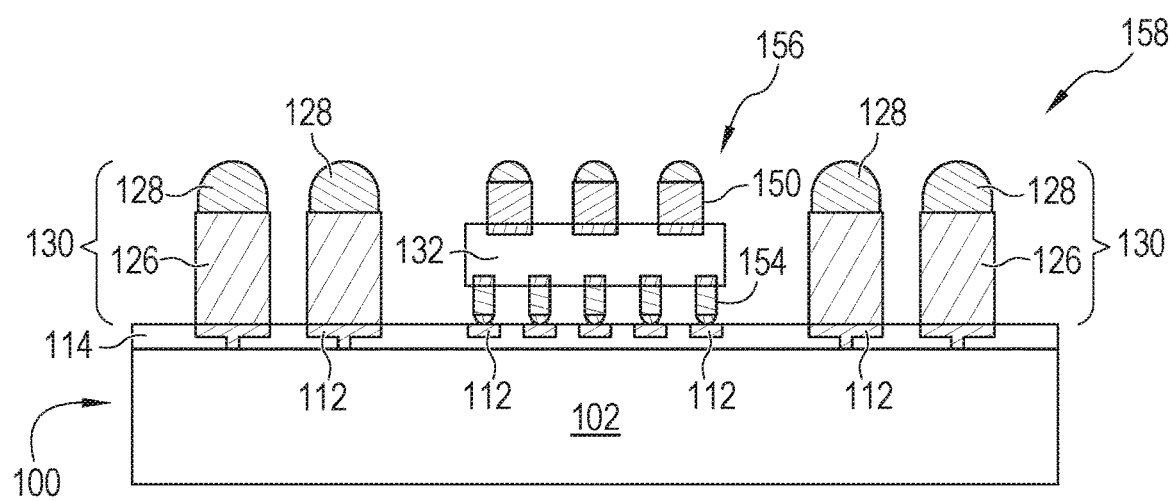

In FIG. 2i, electrical component 156 from FIG. 3c is disposed on surface 110 of semiconductor wafer 100 and electrically and mechanically connected to conductive layer 112. Electrical component 156 is positioned over wafer 100 using a pick and place operation. Electrical component 156 can be semiconductor packages, surface mount devices, discrete electrical devices, or IPDs, such as a diode, transistor, resistor, capacitor, and inductor. Conductive pillars 154 of electrical component 156 are brought into contact with conductive layer 112 of wafer 100 and reflowed. FIG. 2j illustrates electrical component 156 electrically and mechanically connected through conductive pillars 154 to conductive layers 112 of wafer 100.

Figure 2K:
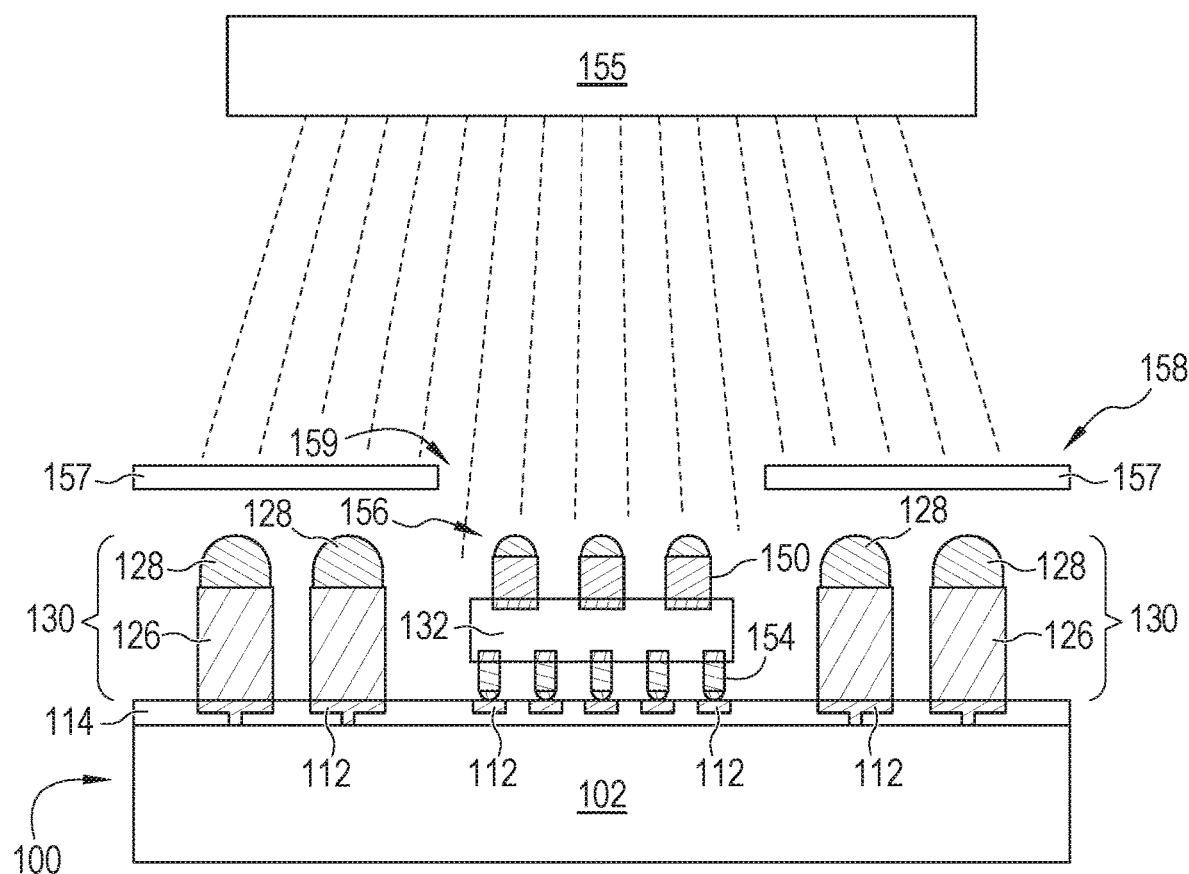

In one embodiment, as shown in FIG. 2k, electrical component 156 is bonded to wafer 100 using laser assist bonding (LAB) with laser 155. In this case, metal mask 157 is disposed over wafer 100 with conductive pillars 130 covered by the metal mask and electrical component 156 exposed through opening 159. Laser 155 is emitted to wafer 100 to selective bond electrical component 156.

Semiconductor wafer 100 is singulated through saw street 106 using a saw blade or laser cutting tool into individual semiconductor die 104 each with additional conductive posts 130 and electrical component 156 disposed over surface 110. The individual semiconductor die 104, with conductive posts 130 and electrical component 140, can be inspected and electrically tested for identification of known good die or known good unit (KGD/KGU) post singulation. The combination of semiconductor die 104 and electrical component 156 constitutes semiconductor package 158.

Figure 2L:
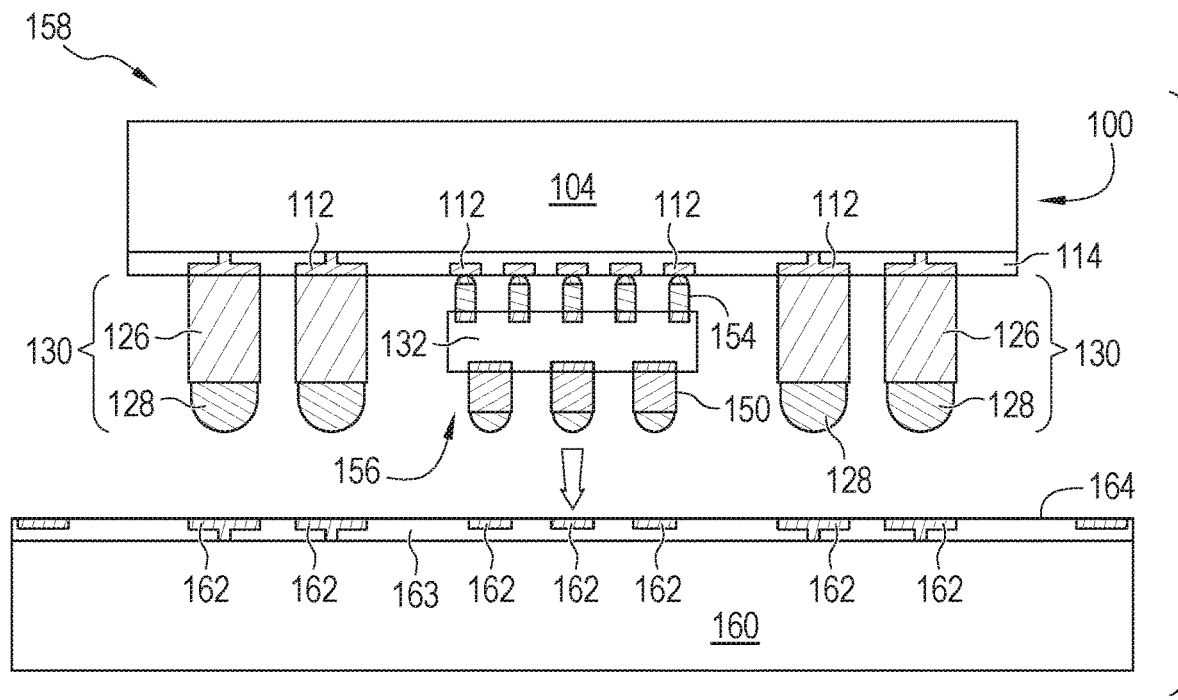

FIG. 2l shows a cross-sectional view of substrate 160 including conductive layers 162 and insulating layers 163. Conductive layer 162 can be one or more layers of Al, Cu, Sn, Ni, Au, Ag, or other suitable electrically conductive material. Substrate 160 further includes electrical interconnect through the substrate. In one embodiment, substrate 160 is a PCB.

Figure 2M:
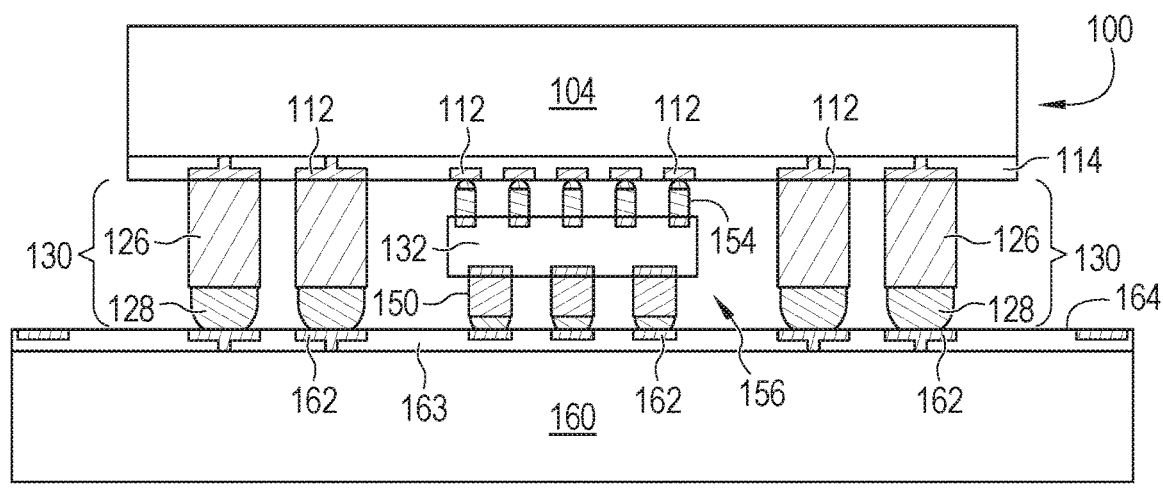

Semiconductor package 158 from FIG. 2k is positioned over surface 164 of substrate 160 with conductive pillars 130 oriented toward the substrate. Semiconductor package 158 is brought into contact with surface 164 of substrate 160. FIG. 2m shows semiconductor package 158 disposed on substrate 160 with conductive pillars 130 and 150 electrically and mechanically connected to conductive layer 162 on surface 164 by reflow. LAB can also be used for bonding semiconductor package 158 to substrate 160, similar to FIG. 2k. In this case, the laser is emitted from the bottom side of substrate 160 to bond semiconductor package 158 to the substrate.

Figure 2N:
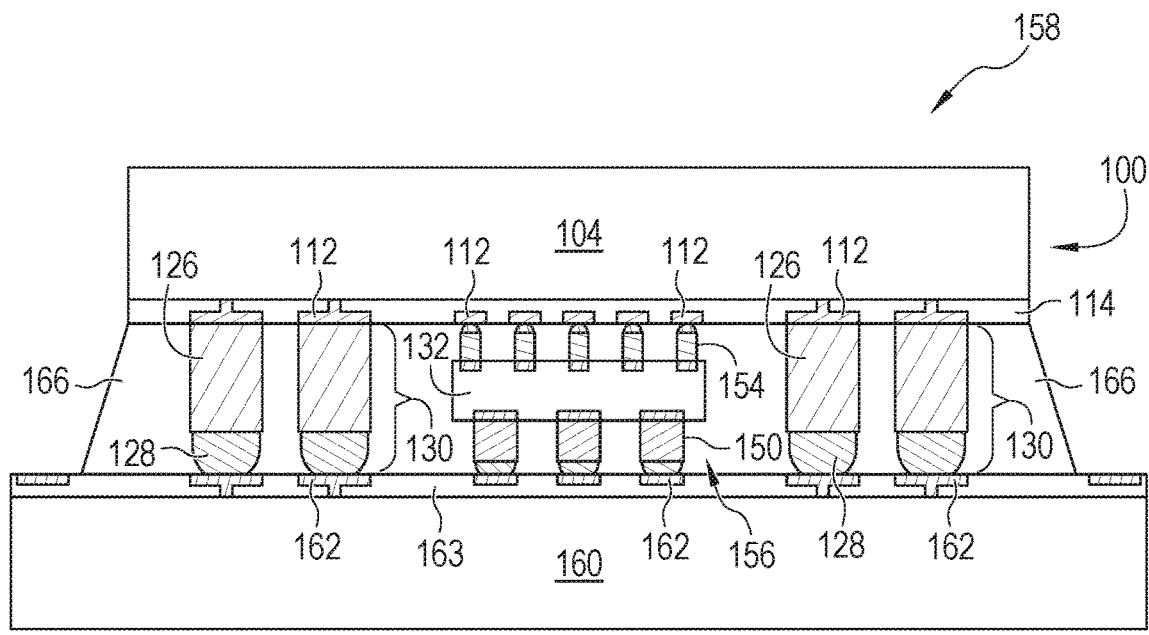

In FIG. 2n, underfill material 166, such as epoxy resin, is deposited under semiconductor die 104 and around conductive pillars 130, 150, 154 and electrical component 156. Underfill material 166 isolates and protects active surfaces of electrical component 156, active surface 110 of semiconductor die 104, and conductive pillars 130, 150, 154.

Electrical components within semiconductor package 158 may contain IPDs that are susceptible to or generate EMI, RFI, harmonic distortion, and inter-device interference. For example, the IPDs contained within semiconductor die 104 or electrical component 156 provide the electrical characteristics needed for high-frequency applications, such as resonators, high-pass filters, low-pass filters, band-pass filters, symmetric Hi-Q resonant transformers, and tuning capacitors. In another embodiment, semiconductor die 104 or electrical component 156 contain digital circuits switching at a high frequency, which could interfere with the operation of other IPDs.

Figure 2O:
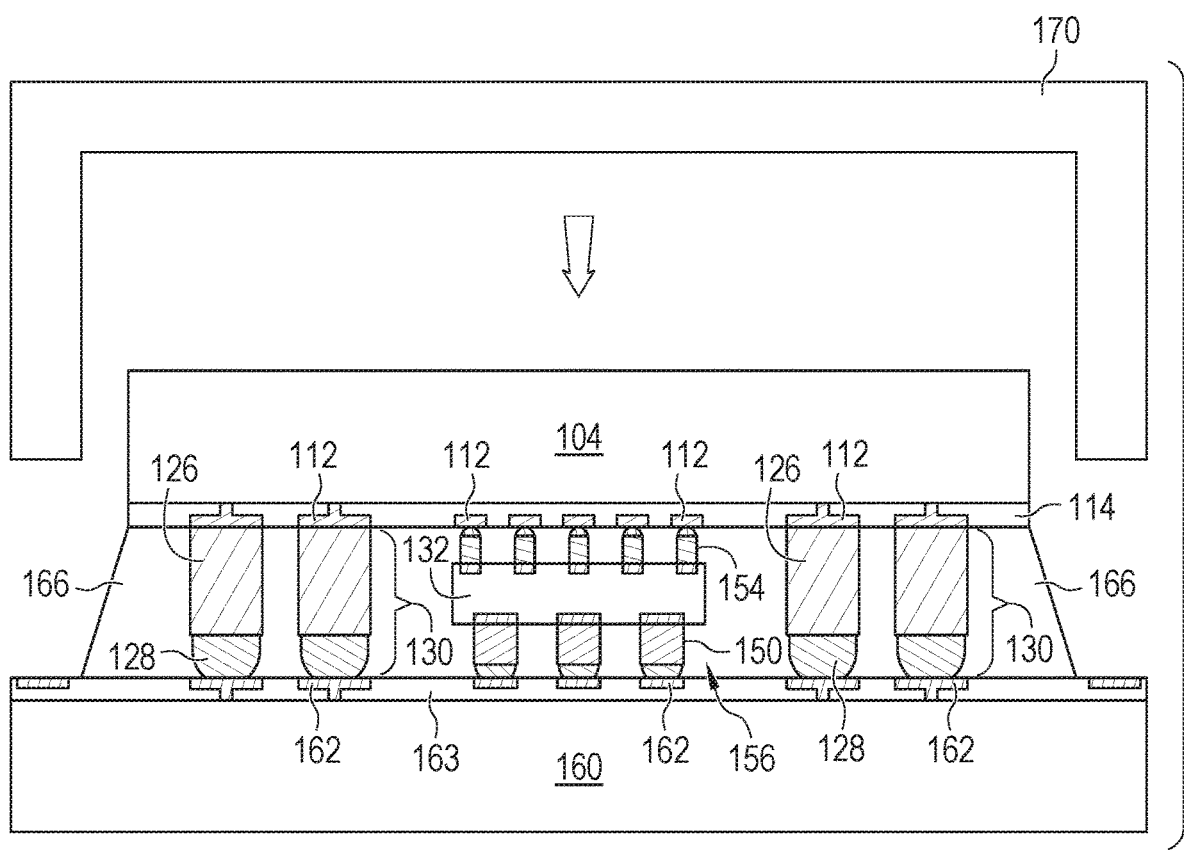
Figure 2P:
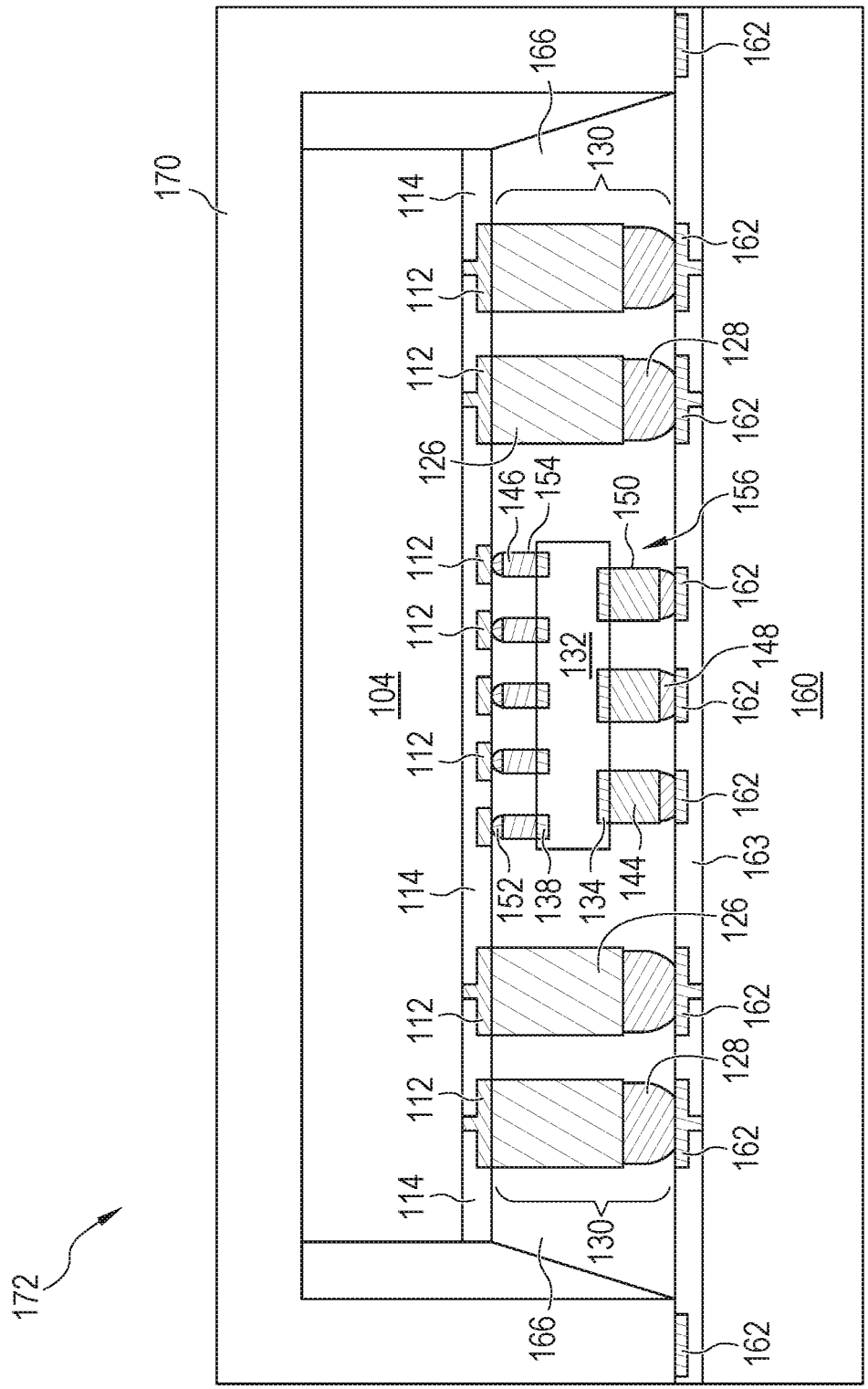

To address EMI, RFI, harmonic distortion, and inter-device interference, shielding frame 170 is positioned over semiconductor package 158, as shown in FIG. 2o. Shielding frame 170 can be one or more layers of Al, Cu, Sn, Ni, Au, Ag, or other suitable conductive material. Alternatively, shielding frame 170 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In FIG. 2p, shielding frame 170 is brought into contact with semiconductor package 158 and substrate 160 and grounded through conductive layer 162 with conductive paste.

Alternatively, frame 170 can be a heat sink or heat spreader with thermal interface material. The heat sink can be one or more layers of Al, Cu, Sn, Ni, Au, Ag, or other suitable thermally conductive material. Heat sink 170 dissipates heat generated by semiconductor package 158.

The combination of semiconductor package 158, substrate 160, and frame 170 constitutes semiconductor assembly 172.

Figure 4A:
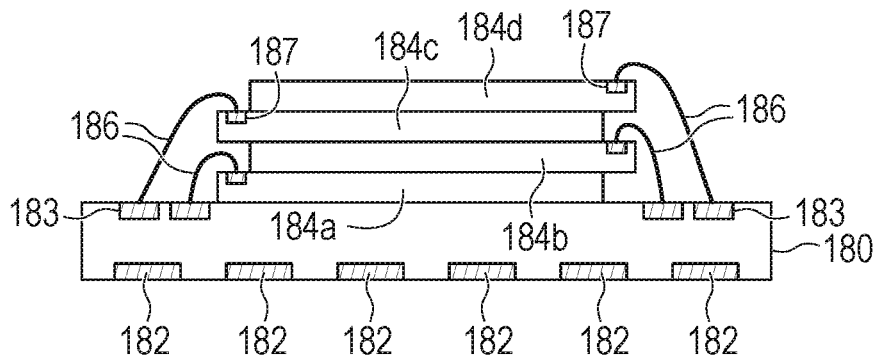
FIGS. 4a-4c illustrate a process of forming a semiconductor package with stacked semiconductor die.

FIG. 4a shows substrate 180 with conductive layers 182 and 183 formed on opposite sides of the substrate as contact pads, similar to FIGS. 2l-2m. A semiconductor die 184a is disposed over substrate 180, semiconductor die 184b is disposed over semiconductor die 184a, semiconductor die 184c is disposed over semiconductor die 184b, and semiconductor die 184d is disposed over semiconductor die 184c. Bond wires 186 electrically connect between conductive layer 187 on semiconductor die 184a-184d and conductive layer 183 on substrate 180. In one embodiment, semiconductor die 184a-184d are stacked memory die.

Figure 4B:
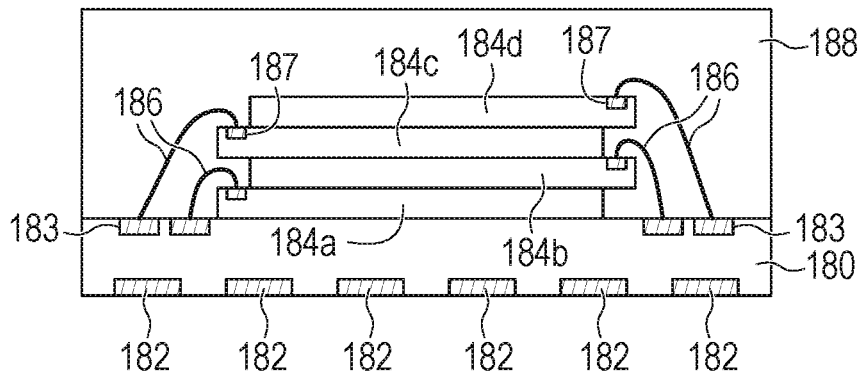

In FIG. 4b, encapsulant or molding compound 188 is deposited over and around semiconductor die 184a-184d, bond wires 186 and substrate 180 using a paste printing, compressive molding, transfer molding, liquid encapsulant molding, vacuum lamination, spin coating, or other suitable applicator. Encapsulant 188 can be polymer composite material, such as epoxy resin with filler, epoxy acrylate with filler, or polymer with proper filler. Encapsulant 188 is non-conductive, provides structural support, and environmentally protects the semiconductor device from external elements and contaminants.

Figure 4C:
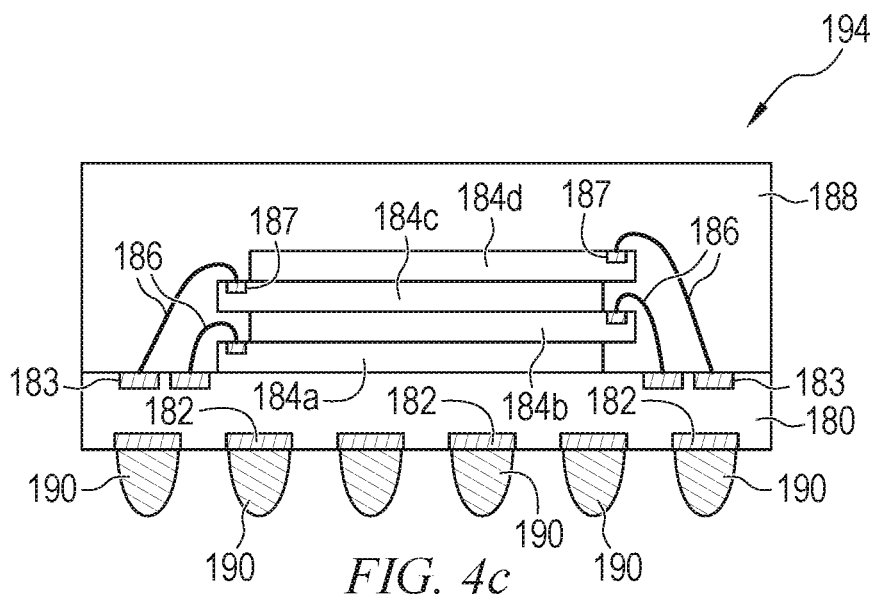

In FIG. 4c, an electrically conductive bump material is deposited over conductive layer 182 of substrate 180 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 182 using a suitable attachment or bonding process. In one embodiment, the bump material is reflowed by heating the material above its melting point to form balls or bumps 190. In one embodiment, bump 190 is formed over an under bump metallization (UBM) having a wetting layer, barrier layer, and adhesive layer. Bump 190 can also be compression bonded or thermocompression bonded to conductive layer 182. In one embodiment, bump 190 is a copper core bump for durability and maintaining its height. Bump 190 represents one type of interconnect structure that can be formed over conductive layer 182. The interconnect structure can also use bond wires, conductive paste, stud bump, micro bump, or other electrical interconnect.

The combination of substrate 180, semiconductor die 184a-184d, bond wires 186, encapsulant 188, and bumps 190 constitute semiconductor package 194. In one embodiment, semiconductor package 194 is a memory device, such as high bandwidth memory.

FIG. 5a shows a cross-sectional view of substrate 200 including conductive layers 202 formed on surface 203 and conductive layer 204 formed on opposite surface 205 as contact pads, similar to FIGS. 2l-2m. Conductive layers 202 and 204 can be one or more layers of Al, Cu, Sn, Ni, Au, Ag, or other suitable electrically conductive material. Substrate 200 further includes electrical interconnect through the substrate. In one embodiment, substrate 200 is a PCB.

Semiconductor package 158 from FIG. 2j and semiconductor package 194 from FIG. 4c are disposed over surface 204 of substrate 200, similar to FIGS. 2l-2m. Underfill material 206, such as epoxy resin, is deposited under semiconductor package 158 and semiconductor package 194. Underfill material 206 isolates and protects active surfaces of semiconductor packages 158 and 194, conductive pillars 130, 150, 154, and bumps 190.

In FIG. 5b, shielding frame 208 is disposed over semiconductor package 158, similar to FIGS. 2l-2m. Shielding frame 208 can be one or more layers of Al, Cu, Sn, Ni, Au, Ag, or other suitable conductive material. Alternatively, shielding frame 208 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference.

Alternatively, frame 208 can be a heat sink or heat spreader with thermal interface material. The heat sink can be one or more layers of Al, Cu, Sn, Ni, Au, Ag, or other suitable thermally conductive material. Heat sink 208 dissipates heat generated by semiconductor package 158.

In FIG. 5c, an electrically conductive bump material is deposited over conductive layer 204 of substrate 200 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 204 using a suitable attachment or bonding process. In one embodiment, the bump material is reflowed by heating the material above its melting point to form balls or bumps 209. In one embodiment, bump 209 is formed over a UBM having a wetting layer, barrier layer, and adhesive layer. Bump 209 can also be compression bonded or thermocompression bonded to conductive layer 204. In one embodiment, bump 209 is a copper core bump for durability and maintaining its height. Bump 209 represents one type of interconnect structure that can be formed over conductive layer 204. The interconnect structure can also use bond wires, conductive paste, stud bump, micro bump, or other electrical interconnect.

In FIG. 5d, semiconductor die or package 210 are disposed over surface 205 of substrate 200, similar to FIGS. 2l-2m. Bumps 212 electrically and mechanically connect semiconductor die 210 to conductive layer 204 of substrate 200 by reflow. Underfill material 214, such as epoxy resin, is deposited under semiconductor die 210. Underfill material 214 isolates and protects active surfaces of semiconductor die 210 and bumps 209.

The combination of semiconductor package 158, semiconductor package 194, substrate 200, frame 208, bumps 209, and semiconductor die 210 constitutes semiconductor assembly 215.

Figure 6A:
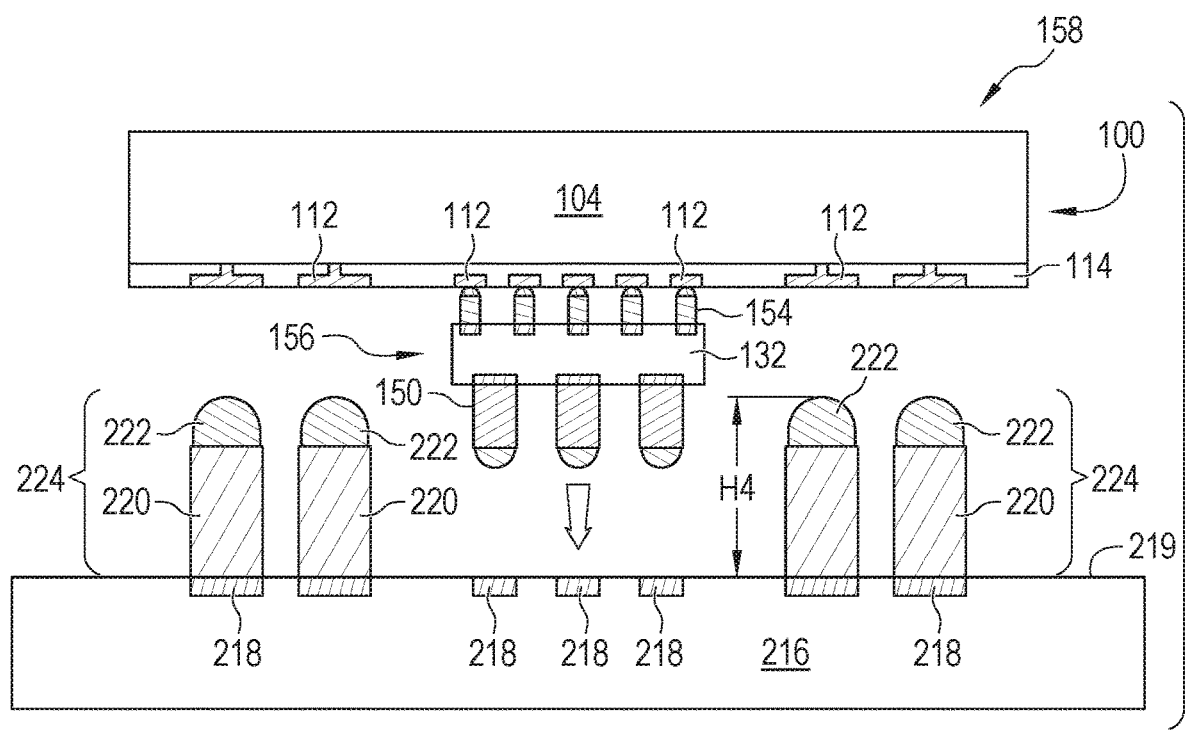
FIGS. 6a-6c illustrate another embodiment of the semiconductor package on a substrate.

In another embodiment as shown in FIG. 6a, substrate 216 includes conductive layers 218 formed on surface 219, similar to FIGS. 2l-2m. Conductive layer 218 can be one or more layers of Al, Cu, Sn, Ni, Au, Ag, or other suitable electrically conductive material. Substrate 216 further includes electrical interconnect through the substrate. In one embodiment, substrate 216 is a PCB.

A plurality of vertical shafts 220 is formed over conductive layer 218, similar to vertical shafts 126 in FIGS. 2b-2f. Bump caps 222 are formed on the distal end of vertical shafts 220 as conductive pillars or columns 224. Bump caps 222 can be Al, Sn, Ni, Au, Ag, Pb, Bi, Cu, solder, and combinations thereof, with an optional flux solution. In one embodiment, conductive pillars 224 have a height H4 of 70-110 μm, depending on the application. Semiconductor package 158 from FIG. 2l, minus conductive pillars 130, is positioned over substrate 216 with electrical component 156 oriented toward the substrate.

Figure 6B:
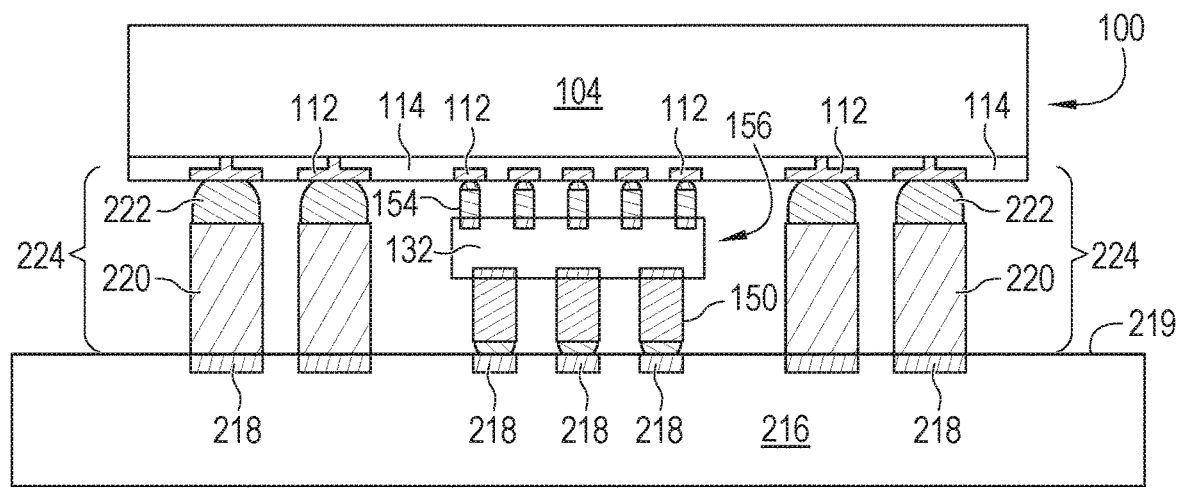

FIG. 6b shows conductive pillars 150 of electrical component 156 electrically and mechanically connected to conductive layer 218 of substrate 216. Likewise, conductive pillars 224 are electrically and mechanically connected to conductive layer 112 of semiconductor package 158 by reflow. In this embodiment, conductive pillars 224 take the place of conductive pillars 130.

Figure 6C:
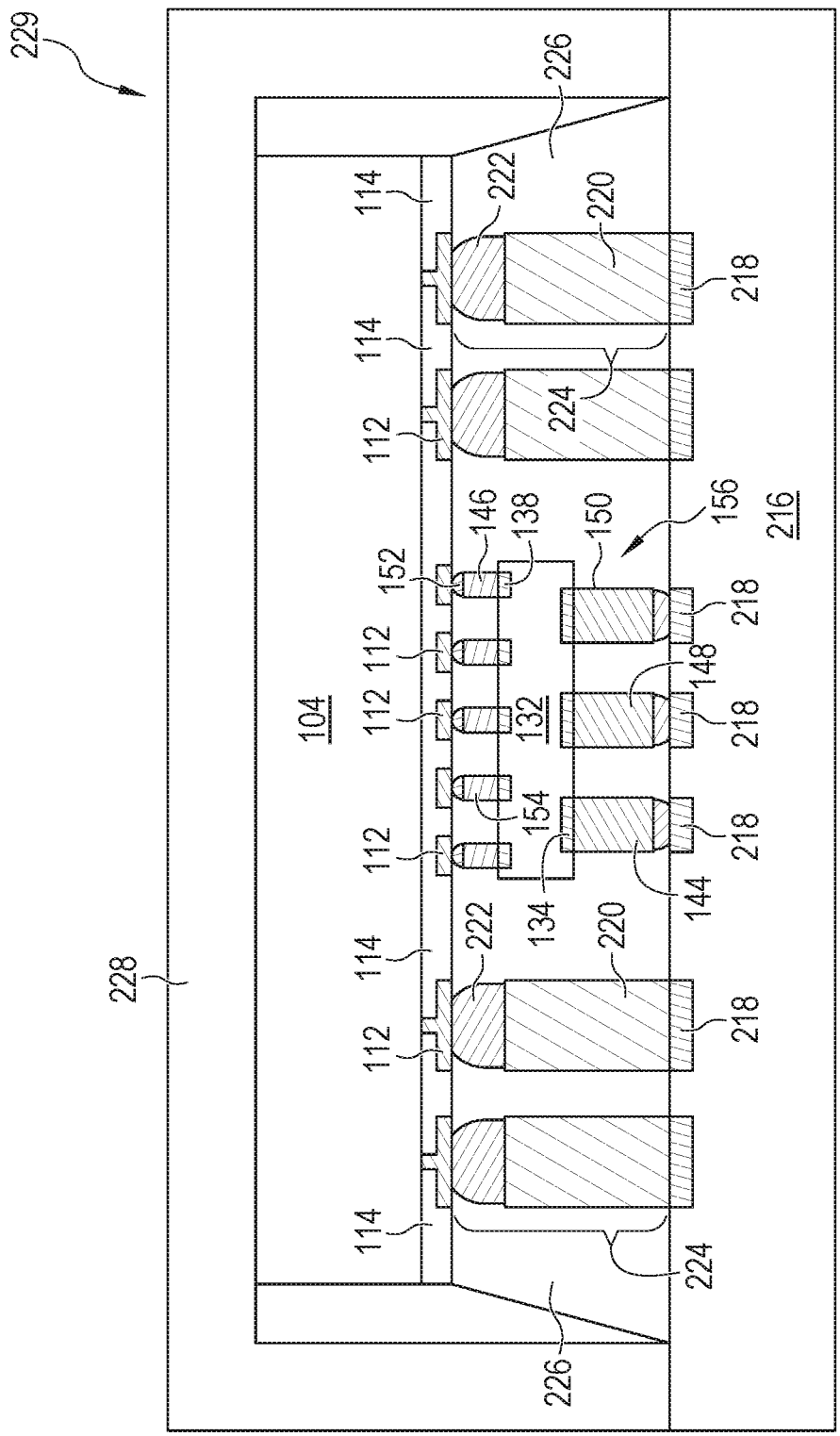

In FIG. 6c, shielding frame 228 is disposed over semiconductor package 158, similar to FIGS. 2o-2p. Shielding frame 228 can be one or more layers of Al, Cu, Sn, Ni, Au, Ag, or other suitable conductive material. Alternatively, shielding frame 228 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference.

Alternatively, frame 228 can be a heat sink or heat spreader with thermal interface material. The heat sink can be one or more layers of Al, Cu, Sn, Ni, Au, Ag, or other suitable thermally conductive material. Heat sink 228 dissipates heat generated by semiconductor package 158.

The combination of semiconductor package 158, substrate 216 with conductive pillars 224, and frame 228 constitutes semiconductor assembly 229.

Figure 7A:
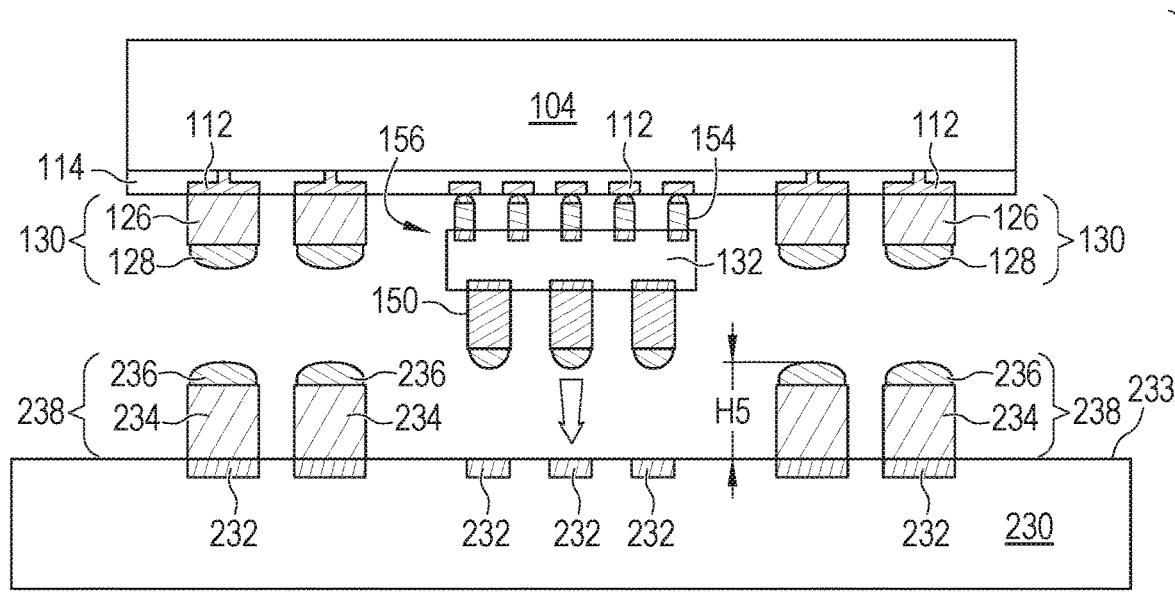
FIGS. 7a-7d illustrate another embodiment of the semiconductor package on a substrate.

In another embodiment as shown in FIG. 7a, substrate 230 includes conductive layers 232 formed on surface 233, similar to FIGS. 2l-2m. Conductive layer 232 can be one or more layers of Al, Cu, Sn, Ni, Au, Ag, or other suitable electrically conductive material. Substrate 230 further includes electrical interconnect through the substrate. In one embodiment, substrate 230 is a PCB.

A plurality of vertical shafts 234 is formed over conductive layer 232, similar to vertical shafts 126 in FIGS. 2b-2f. Bump caps 236 are formed on the distal end of vertical shafts 234 as conductive pillars or columns 238. Bump caps 236 can be Al, Sn, Ni, Au, Ag, Pb, Bi, Cu, solder, and combinations thereof, with an optional flux solution. In one embodiment, conductive pillars 238 have a height H5 of 35-55 μm, or about one-half of H1. Semiconductor package 158 from FIG. 2l, is positioned over substrate 216 with conductive pillars 130 and electrical component 156 oriented toward the substrate. In this case, conductive pillars 130 are of a lesser height, as compared to FIG. 2f, by nature of conductive pillars 238.

Figure 7B:
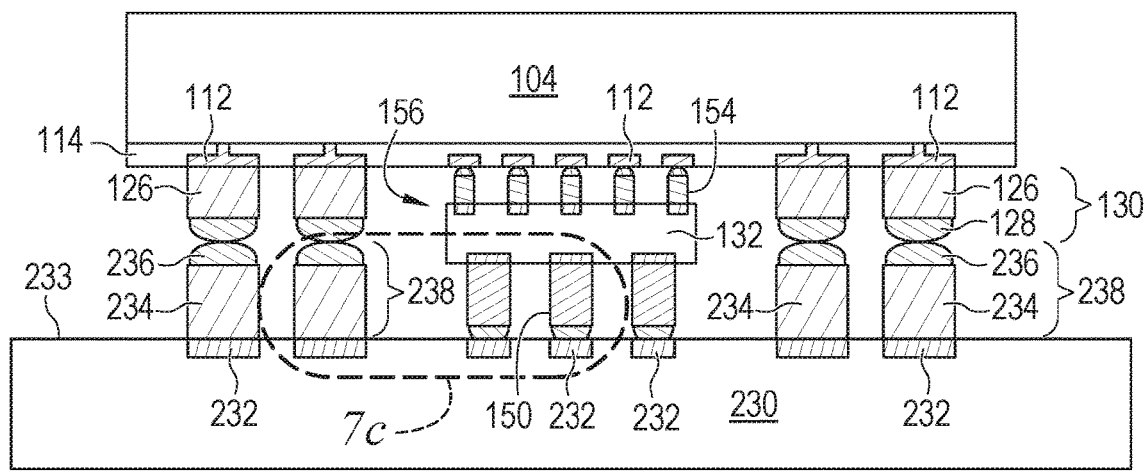

FIG. 7b shows conductive pillars 150 of electrical component 156 electrically and mechanically connected to conductive layer 232 of substrate 230. Likewise, conductive pillars 228 are electrically and mechanically connected to conductive pillars 130 of semiconductor package 158. In this embodiment, semiconductor package 158 and substrate 230 each have conductive pillars that meet between the structures.

Figure 7C:
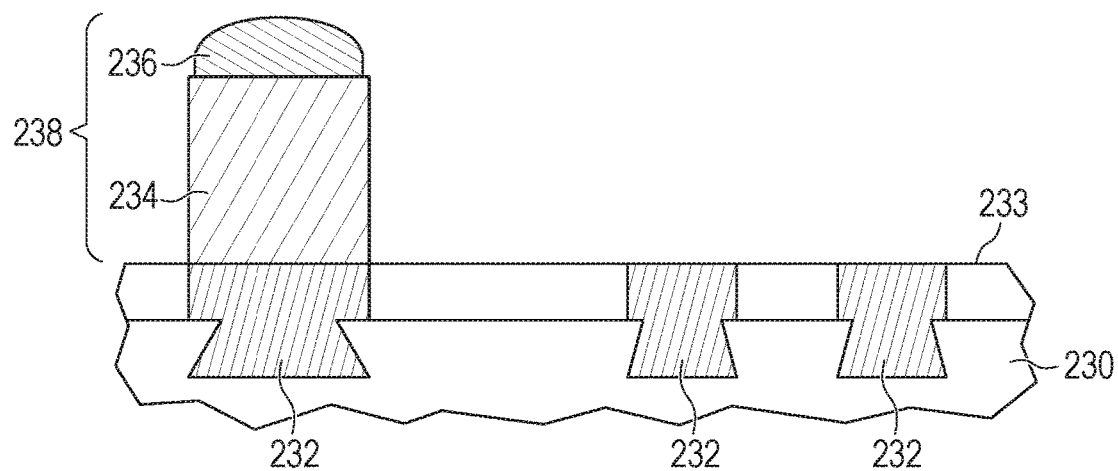
Figure 7D:
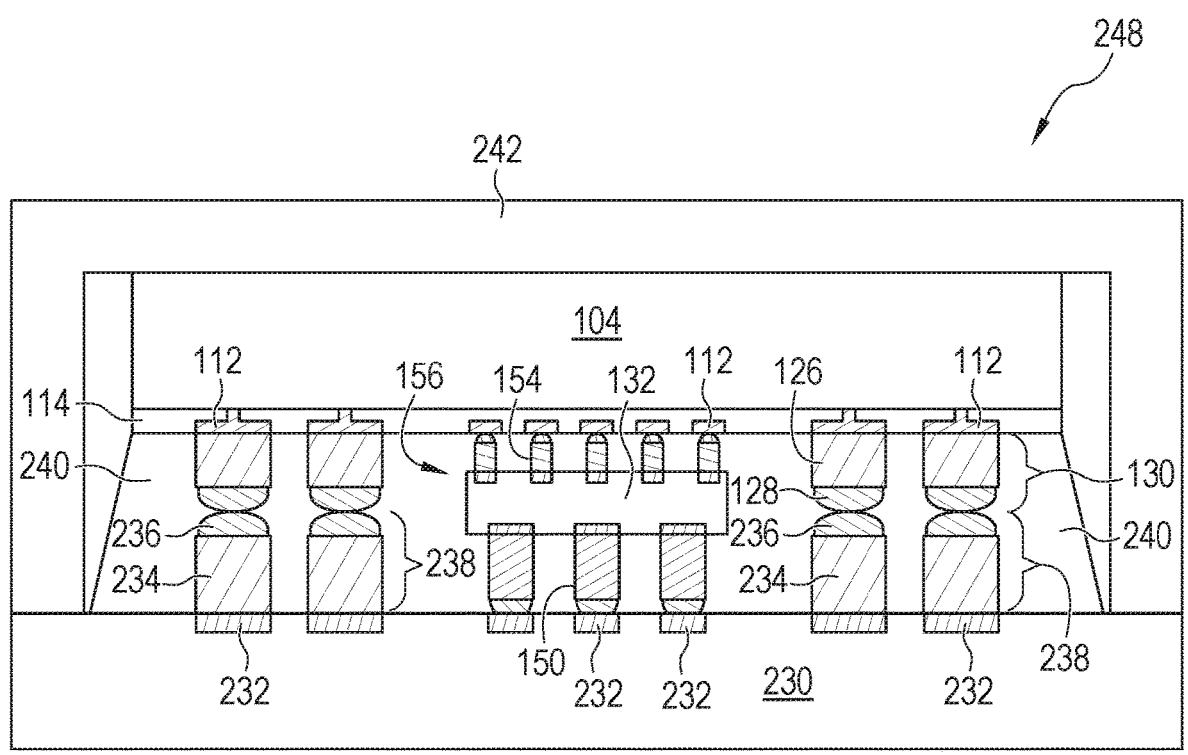

FIG. 7c shows further detail of interconnect area 7c from FIG. 7b. Conductive layer 232 extends into substrate 230. In FIG. 7d, underfill material 240, such as epoxy resin, is deposited under semiconductor package 158. Underfill material 240 isolates and protects active surfaces of semiconductor package 158 and conductive pillars 130, 150, 154, 228.

Shielding frame 242 is disposed over semiconductor package 158, similar to FIGS. 2o-2p. Shielding frame 242 can be one or more layers of Al, Cu, Sn, Ni, Au, Ag, or other suitable conductive material. Alternatively, shielding frame 242 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference.

Alternatively, frame 242 can be a heat sink or heat spreader with thermal interface material. The heat sink can be one or more layers of Al, Cu, Sn, Ni, Au, Ag, or other suitable thermally conductive material. Heat sink 242 dissipates heat generated by semiconductor package 158.

The combination of semiconductor package 158, substrate 216 with conductive pillars 238, and frame 242 constitutes semiconductor assembly 248.

Figure 8A:
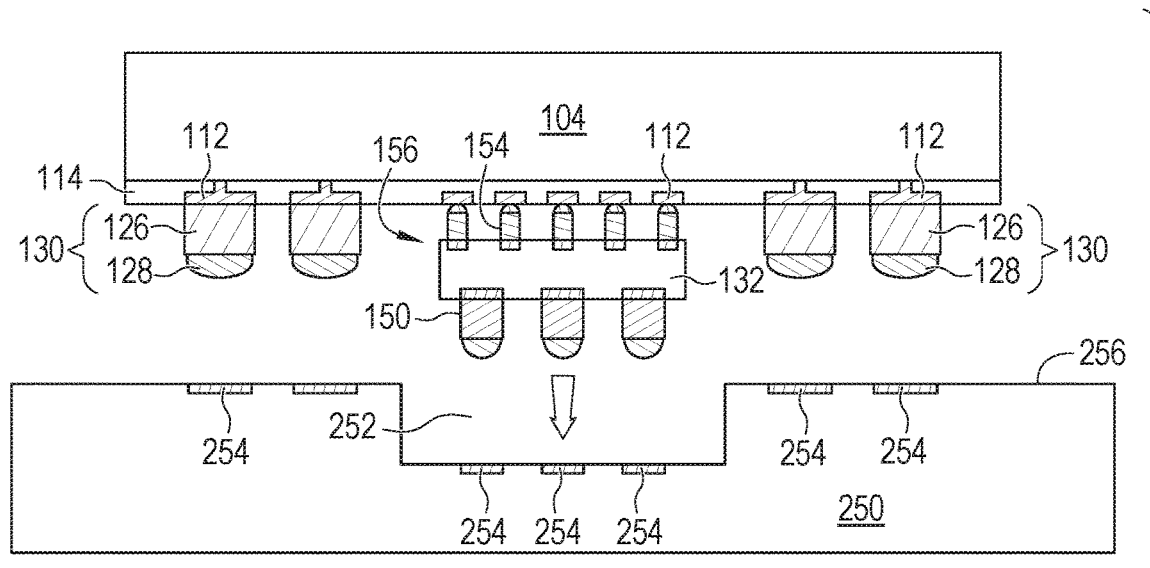
FIGS. 8a-8c illustrate another embodiment of the semiconductor package on a substrate with a cavity.

In another embodiment, substrate 250 includes cavity 252, as shown in FIG. 8a. Conductive layers 254 formed on surface 256 and in cavity 252. Conductive layer 254 can be one or more layers of Al, Cu, Sn, Ni, Au, Ag, or other suitable electrically conductive material. Substrate 250 further includes electrical interconnect through the substrate. In one embodiment, substrate 250 is a PCB.

Figure 8B:
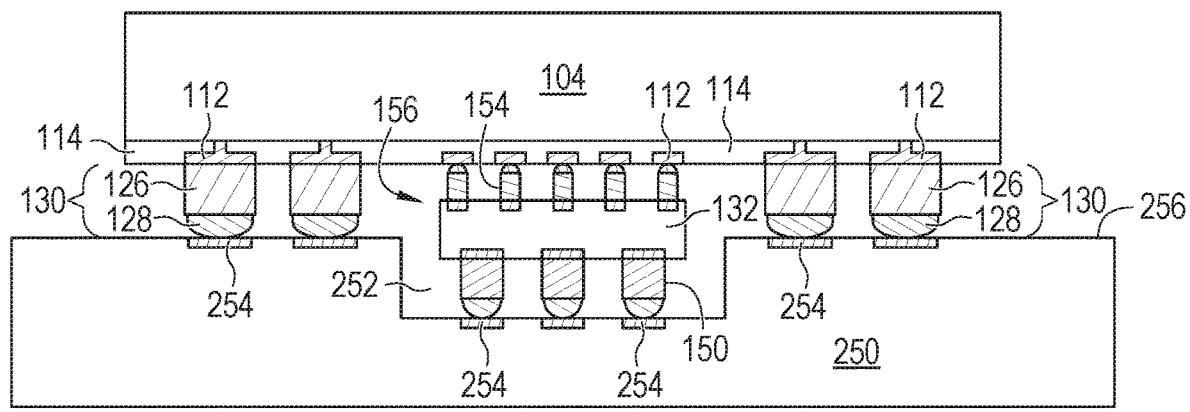

FIG. 8b shows conductive pillars 130 and conductive pillars 150 electrically and mechanically connected to conductive layer 254 of substrate 250. Electrical component 156 is disposed at least partially in cavity 252.

Figure 8C:
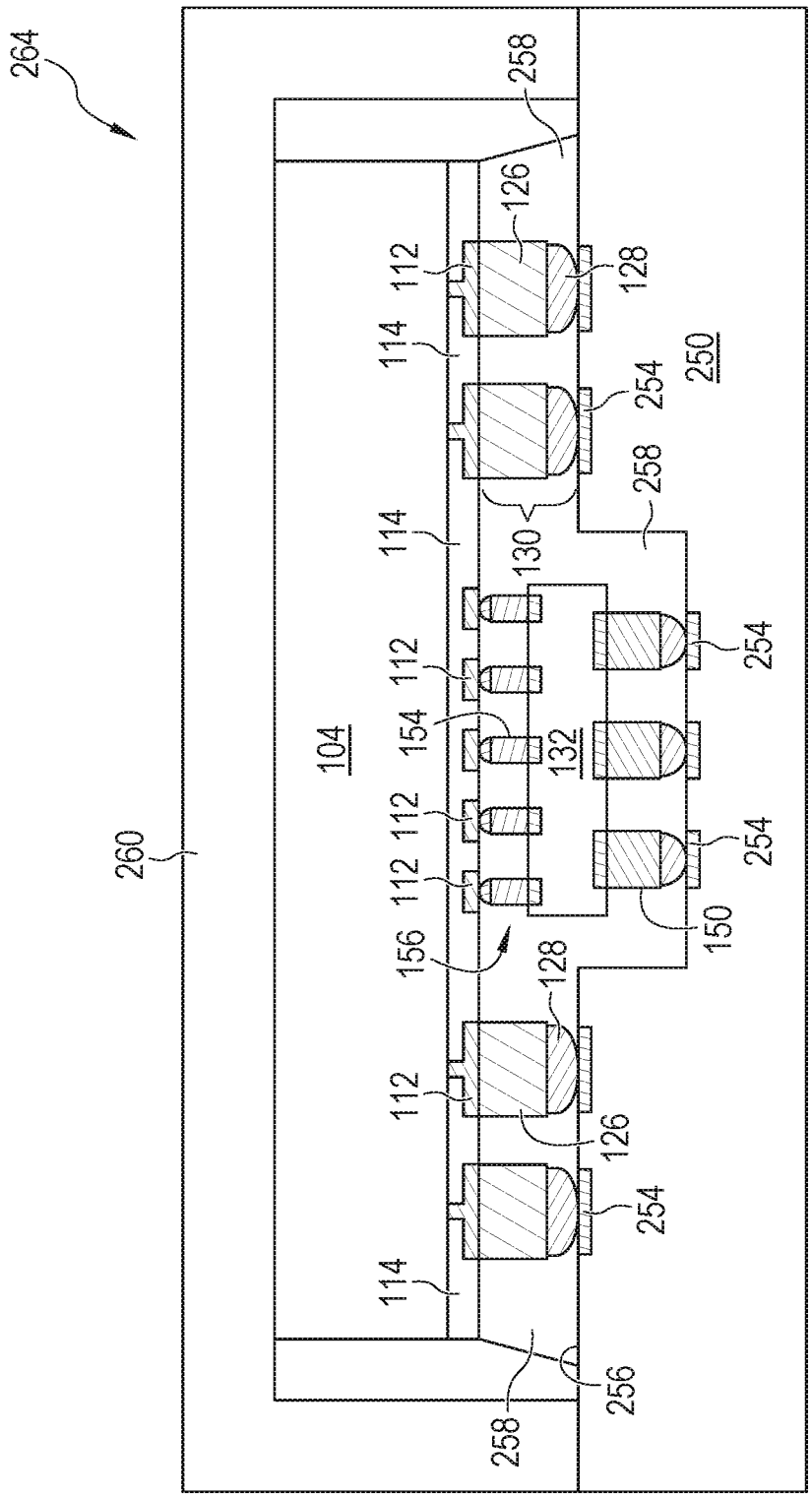

In FIG. 8c, underfill material 258, such as epoxy resin, is deposited under semiconductor package 158. Underfill material 258 isolates and protects active surfaces of semiconductor package 158 and conductive pillars 130, 150, 154.

Shielding frame 260 is disposed over semiconductor package 158, similar to FIGS. 2o-2p. Shielding frame 260 can be one or more layers of Al, Cu, Sn, Ni, Au, Ag, or other suitable conductive material. Alternatively, shielding frame 260 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference.

Alternatively, frame 260 can be a heat sink or heat spreader with thermal interface material. The heat sink can be one or more layers of Al, Cu, Sn, Ni, Au, Ag, or other suitable thermally conductive material. Heat sink 260 dissipates heat generated by semiconductor package 158.

The combination of semiconductor package 158, substrate 250, and frame 260 constitutes semiconductor assembly 264.

Figure 9:
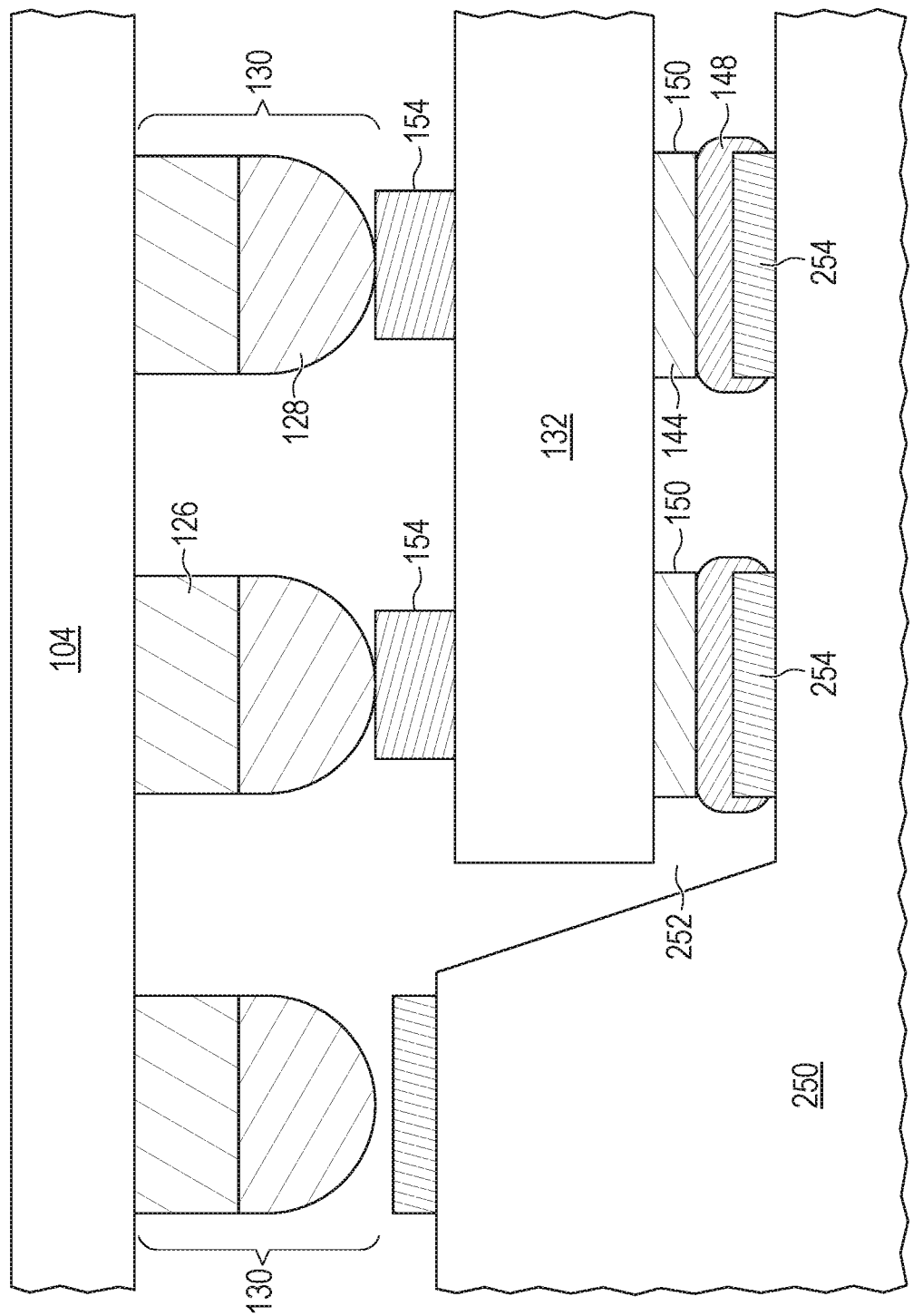
FIG. 9 illustrates further detail of the interconnect structure within the cavity of the substrate.

FIG. 9 illustrates one embodiment of further detail of the interconnect structure between semiconductor die 104 and substrate 250 and semiconductor die 132, and the interconnect structure between semiconductor die 132 and substrate 250 within cavity 252.

Figure 10:
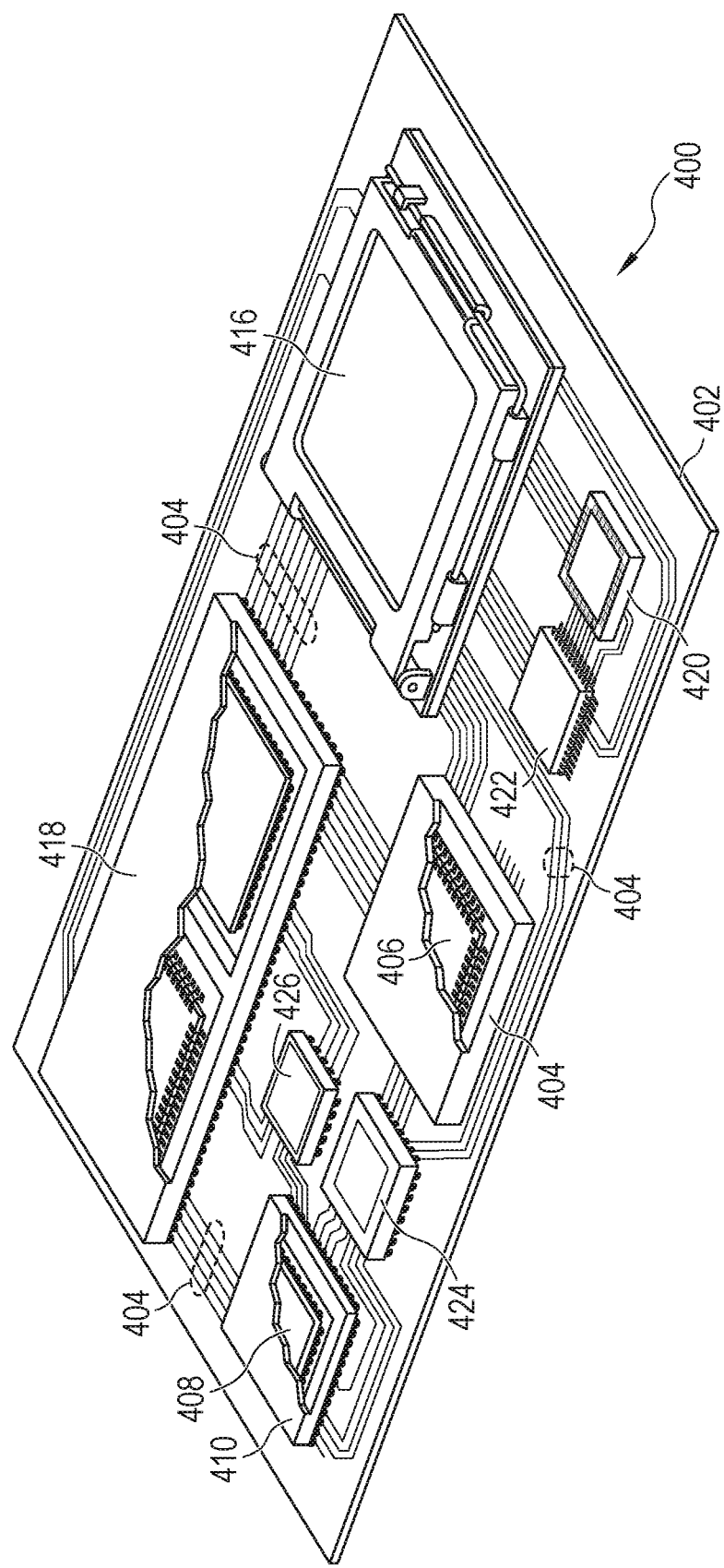
FIG. 10 illustrates a printed circuit board (PCB) with different types of packages disposed on a surface of the PCB.

FIG. 10 illustrates electrical device 400 having a chip carrier substrate or PCB 402 with a plurality of semiconductor packages disposed on a surface of PCB 402, including BGA semiconductor assemblies 172, 215, 229, 248, and 264. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 10, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   providing a substrate;
   forming a plurality of first conductive pillars over the semiconductor die or substrate;
   disposing an electrical component over the semiconductor die; and
   disposing the semiconductor die and electrical component over the substrate, wherein the electrical component includes a first electrical connection disposed on a first surface of the electrical component and electrically connected to the semiconductor die and further includes a second electrical connection disposed on a second surface of the electrical component opposite the first surface of the electrical component and electrically connected to the substrate.

2. The method of claim 1, wherein the electrical component includes an integrated passive device.

3. The method of claim 1, further including disposing a shielding frame over the semiconductor die.

4. The method of claim 1, wherein the first electrical connection includes forming a plurality of second conductive pillars over the first surface of the electrical component.

5. The method of claim 4, wherein the second electrical connection includes forming a plurality of third conductive pillars over the second surface of the electrical component opposite the first surface of the electrical component.

6. The method of claim 1, wherein providing the substrate includes:
  forming a cavity in the substrate; and
  disposing the electrical component at least partially within the cavity.

7. A method of making a semiconductor device, comprising:
  providing a substrate;
  disposing a semiconductor die over the substrate; and
  disposing an electrical component between the semiconductor die and substrate, wherein the electrical component includes a first electrical connection directly to the semiconductor die and a second electrical connection directly to the substrate.

8. The method of claim 7, further including forming a plurality of conductive pillars over the semiconductor die or substrate.

9. The method of claim 7, wherein the electrical component includes an integrated passive device.

10. The method of claim 7, further including disposing a shielding frame over the semiconductor die.

11. The method of claim 7, wherein the first electrical connection includes forming a plurality of first conductive pillars over a first surface of the electrical component directly to the semiconductor die.

12. The method of claim 11, wherein the second electrical connection includes forming a plurality of second conductive pillars over a second surface of the electrical component opposite the first surface of the electrical component directly to the substrate.

13. The method of claim 7, wherein providing the substrate includes:
  forming a cavity in the substrate; and
  disposing the electrical component at least partially within the cavity.

14. A semiconductor device, comprising:
  a semiconductor die;
  a substrate;
  a plurality of first conductive pillars formed over the semiconductor die or substrate; and
  an electrical component disposed over the semiconductor die, where the semiconductor die and electrical component are disposed over the substrate and the electrical component includes a first electrical connection to the semiconductor die and a second electrical connection to the substrate.

15. The semiconductor device of claim 14, wherein the electrical component includes an integrated passive device.

16. The semiconductor device of claim 14, further including a shielding frame disposed over the semiconductor die.

17. The semiconductor device of claim 14, wherein the first electrical connection includes a plurality of second conductive pillars formed over a first surface of the electrical component to the semiconductor die.

18. The semiconductor device of claim 17, wherein the second electrical connection includes a plurality of third conductive pillars formed over a second surface of the electrical component opposite the first surface of the electrical component to the substrate.

19. The semiconductor device of claim 14, wherein the substrate includes a cavity and the electrical component is disposed at least partially within the cavity.

20. A semiconductor device, comprising:
  a substrate;
  a semiconductor die disposed over the substrate; and
  an electrical component disposed between the semiconductor die and substrate, wherein the electrical component includes a first electrical connection to the semiconductor die and a second electrical connection to substrate.

21. The semiconductor device of claim 20, further including a plurality of conductive pillars formed over the semiconductor die or substrate.

22. The semiconductor device of claim 20, wherein the electrical component includes an integrated passive device.

23. The semiconductor device of claim 20, further including a shielding frame disposed over the semiconductor die.

24. The semiconductor device of claim 20, wherein the first electrical connection includes a plurality of first conductive pillars formed over a first surface of the electrical component to the semiconductor die.

25. The semiconductor device of claim 24, wherein the second first electrical connection includes a plurality of second conductive pillars formed over a second surface of the electrical component opposite the first surface of the electrical component to the substrate.

* * * * *

UNITED STATES PATENT AND TRADEMARK OFFICE
CERTIFICATE OF CORRECTION

| | |
|---|---|
| PATENT NO. | : 12,424,595 B2 |
| APPLICATION NO. | : 17/820156 |
| DATED | : September 23, 2025 |
| INVENTOR(S) | : TaeKeun Lee et al. |

It is certified that error appears in the above-identified patent and that said Letters Patent is hereby corrected as shown below:

In the Claims

Column 12, Claim 25, second Line, delete the word "first" after the word "second".

Signed and Sealed this
Twenty-first Day of October, 2025

John A. Squires
*Director of the United States Patent and Trademark Office*